US012721228B2

(12) United States Patent
Ahn et al.

(10) Patent No.: US 12,721,228 B2
(45) Date of Patent: Aug. 25, 2026

(54) SEMICONDUCTOR PACKAGE INCLUDING A PLURALITY OF SEMICONDUCTOR CHIPS IN A STACKED STRUCTURE

(71) Applicant: SAMSUNG ELECTRONICS CO., LTD., Suwon-si (KR)

(72) Inventors: Duhyoung Ahn, Suwon-si (KR); Minseok Kang, Suwon-si (KR); Sungwook Moon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 404 days.

(21) Appl. No.: 18/420,210

(22) Filed: Jan. 23, 2024

(65) Prior Publication Data

US 2024/0258275 A1 Aug. 1, 2024

(30) Foreign Application Priority Data

Feb. 1, 2023 (KR) ........................ 10-2023-0013883
May 22, 2023 (KR) ........................ 10-2023-0065879

(51) Int. Cl.
*H10W 90/00* (2026.01)
*H10P 74/00* (2026.01)
*H10W 90/20* (2026.01)

(52) U.S. Cl.
CPC ........... *H10W 90/00* (2026.01); *H10P 74/273* (2026.01); *H10W 90/297* (2026.01); *H10W 90/722* (2026.01)

(58) Field of Classification Search
CPC . H10W 90/00; H10W 90/297; H10W 90/722; H10P 74/273

(Continued)

(56) References Cited

U.S. PATENT DOCUMENTS 9,559,040 B2 1/2017 Batra et al.
10,121,743 B2 11/2018 Kamal et al.
(Continued)

FOREIGN PATENT DOCUMENTS

CN 108987374 B 6/2020
JP 4209577 B2 1/2009
(Continued)

OTHER PUBLICATIONS

Extended European Search Report dated Jul. 10, 2024, issued by the European Patent Office in European Application No. 24154704.1.

*Primary Examiner* — Igwe U Anya
(74) *Attorney, Agent, or Firm* — Sughrue Mion, PLLC

(57) ABSTRACT

A semiconductor package includes a first semiconductor chip, a second semiconductor chip stacked on the first semiconductor chip, and a plurality of external connection terminals electrically coupled to a lower surface of the first semiconductor chip. The first semiconductor chip includes a substrate including the lower surface and an opposite upper surface, a lower wiring layer in a lower portion of the lower surface including a first plurality of wiring patterns, an upper wiring layer in an upper portion of the upper surface including a second plurality of wiring patterns, a plurality of through structures electrically coupling the lower wiring layer to the upper wiring layer and penetrating the substrate, and a macro cell disposed between the plurality of through structures. At least one of the through structures partially overlaps a wiring pattern of the lower wiring layer in a vertical direction within an overlapping distance from the wiring pattern.

20 Claims, 12 Drawing Sheets

(58) Field of Classification Search
USPC .......................................................... 257/734
See application file for complete search history.

(56) References Cited

U.S. PATENT DOCUMENTS

| | | | | |
|---|---|---|---|---|
| 11,081,426 | B2 | 8/2021 | Mohamed et al. | |
| 11,270,977 | B2 | 3/2022 | Jain et al. | |
| 11,551,996 | B2 | 1/2023 | Choi | |
| 2010/0037197 | A1 | 2/2010 | Fukunaga | |
| 2021/0134761 | A1* | 5/2021 | Oh | H10W 90/00 |
| 2021/0210468 | A1 | 7/2021 | Takeno et al. | |
| 2021/0257305 | A1* | 8/2021 | Yim | H10W 70/614 |
| 2023/0131240 | A1* | 4/2023 | Ko | H10W 70/65 257/690 |

FOREIGN PATENT DOCUMENTS

| | | |
|---|---|---|
| JP | 2010-21187 A | 1/2010 |
| KR | 10-2281063 B1 | 7/2021 |

* cited by examiner

SEMICONDUCTOR PACKAGE INCLUDING A PLURALITY OF SEMICONDUCTOR CHIPS IN A STACKED STRUCTURE

CROSS-REFERENCE TO RELATED APPLICATIONS

This application claims benefit of priority under 35 U.S.C. § 119 to Korean Patent Application No. 10-2023-0013883, filed on Feb. 1, 2023, and to Korean Patent Application No. 10-2023-0065879, filed on May 22, 2023, in the Korean Intellectual Property Office, the disclosures of which are incorporated by reference herein in their entireties.

BACKGROUND

1. Field

The present disclosure relates generally to a semiconductor package, and more particularly, to a semiconductor package including a plurality of semiconductor chips in a stacked structure.

2. Description of Related Art

According to the rapid development in the electronics industry and increasing user demands, related electronic devices may become further miniaturized, more multi-functional, and larger in capacity. Accordingly, there may be a demand for semiconductor packages that may include a plurality of semiconductor chips. Consequently, there exists a need for further improvements in semiconductor packages having a three-dimensional (3D) stacked structure in which a plurality of semiconductor chips are stacked in a vertical direction.

SUMMARY

Aspects of the present disclosure provide for a semiconductor package including a plurality of semiconductor chips in a stacked structure.

According to an aspect of the present disclosure, a semiconductor package is provided. The semiconductor package includes a first semiconductor chip, a second semiconductor chip stacked on the first semiconductor chip, and a plurality of external connection terminals electrically coupled to a lower surface of the first semiconductor chip. The first semiconductor chip includes a substrate including the lower surface and an upper surface opposite to the lower surface, a lower wiring layer in a lower portion of the lower surface including a first plurality of wiring patterns, an upper wiring layer in an upper portion of the upper surface including a second plurality of wiring patterns, a plurality of through structures electrically coupling the lower wiring layer to the upper wiring layer and penetrating the substrate, and a macro cell disposed between the plurality of through structures. The first plurality of wiring patterns extend in a first horizontal direction. Wiring patterns of the first plurality of wiring patterns are spaced apart from each other by a first pitch distance in a second horizontal direction. At least one through structure of the plurality of through structures at least partially overlaps a wiring pattern of the lower wiring layer in a vertical direction within an overlapping distance from the wiring pattern of the lower wiring layer. The overlapping distance is half of the first pitch distance.

According to an aspect of the present disclosure, a semiconductor package is provided. The semiconductor package includes a first semiconductor chip, a second semiconductor chip stacked on the first semiconductor chip, and a plurality of external connection terminals electrically coupled to a lower surface of the first semiconductor chip. The first semiconductor chip includes a substrate including the lower surface and an upper surface opposite to the lower surface, a lower wiring layer in a lower portion of the lower surface including a first plurality of wiring patterns, an upper wiring layer in an upper portion of the upper surface and including a second plurality of wiring patterns, a plurality of through structures electrically coupling the lower wiring layer to the upper wiring layer and penetrating the substrate, and a macro cell disposed between the plurality of through structures. The second plurality of wiring patterns extend in a first horizontal direction. Wiring patterns of the second plurality of wiring patterns are spaced apart from each other by a first pitch distance in a second horizontal direction. At least one through structure of the plurality of through structures at least partially overlaps a wiring pattern of the upper wiring layer in a vertical direction within an overlapping distance from the wiring pattern of the upper wiring layer. The overlapping distance is half of the first pitch distance.

According to an aspect of the present disclosure, a semiconductor package is provided. The semiconductor package includes a first semiconductor chip, a second semiconductor chip stacked on the first semiconductor chip, and a plurality of external connection terminals electrically coupled to a lower surface of the first semiconductor chip. The first semiconductor chip includes a power delivery network (PDN) configured to deliver power signals to the second semiconductor chip via the plurality of external connection terminals. The PDN of the first semiconductor chip includes a first wiring layer including a first plurality of wiring patterns, a second wiring layer including a second plurality of wiring patterns and formed at a second level different from a first level of the first wiring layer, and a plurality of through structures electrically coupling the first wiring layer to the second wiring layer. The first plurality of wiring patterns extend in a first horizontal direction. Wiring patterns of the first plurality of wiring patterns are spaced apart from each other by a first pitch distance in a second horizontal direction. At least one through structure at least partially overlaps a wiring pattern of the first wiring layer in a vertical direction within an overlapping distance from the wiring pattern of the first wiring layer. The overlapping distance is half of the first pitch distance.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which.

DETAILED DESCRIPTION

Figure 1:
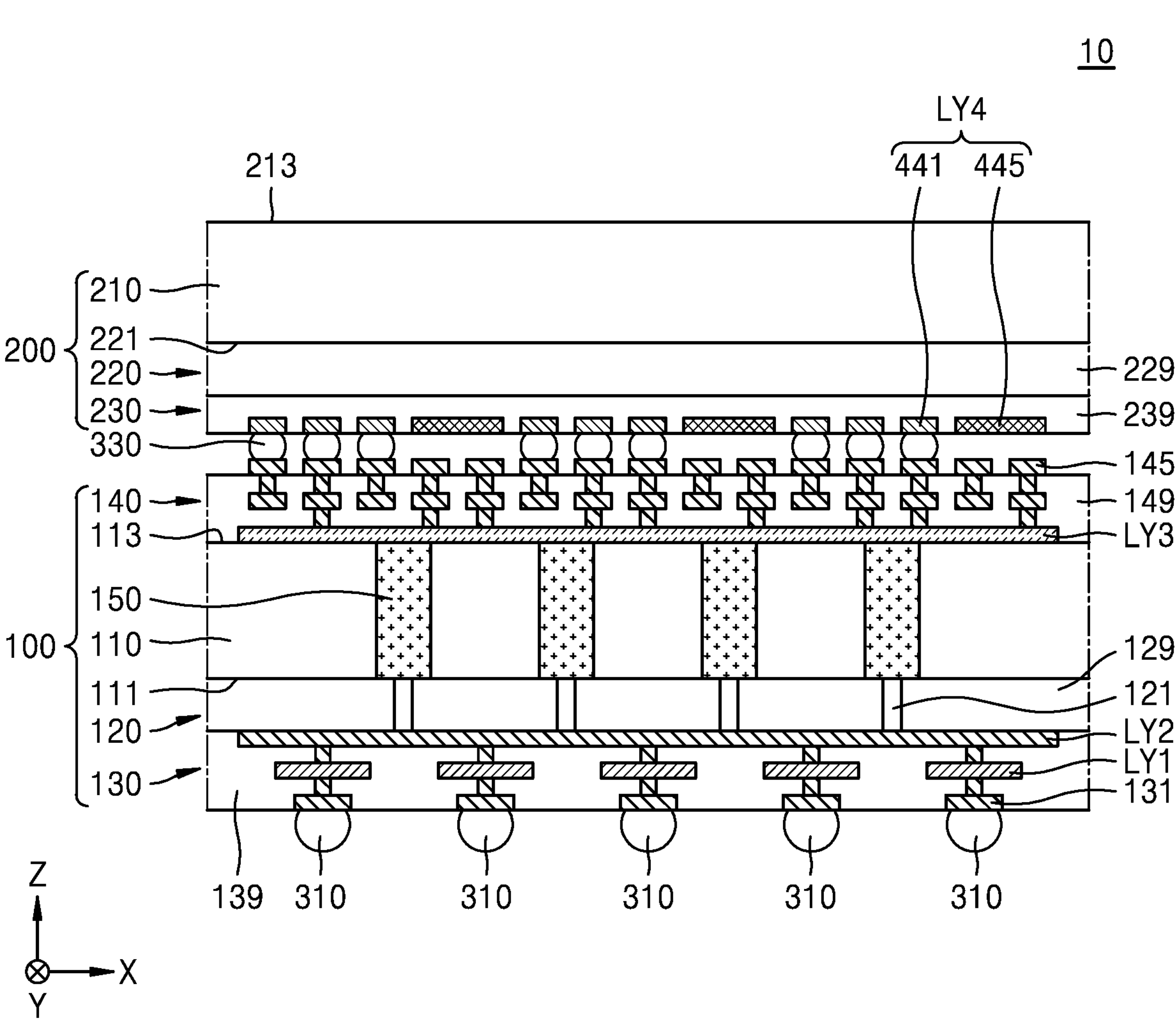
FIG. 1 is a cross-sectional view illustrating a semiconductor package, according to some embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to describe various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

The embodiments herein may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

As used herein, a vertical direction may refer to a Z direction, and a horizontal direction may refer to a direction perpendicular to the Z direction. A first horizontal direction and a second horizontal direction may refer to directions crossing each other. The first horizontal direction may be referred to as an X direction, and the second horizontal direction may be referred to as a Y direction. A vertical level may refer to a height level in the vertical direction. A wiring layer may refer to a set of conductive elements (e.g., conductive patterns) forming one layer at a substantially similar and/or the same vertical level. Different wiring layers may be disposed at different vertical levels. A horizontal width of a component may refer to a length of the component in the horizontal direction, and a line width of the component may refer to a length in a direction perpendicular to an extension direction of the component. A pitch distance may refer to a length in the horizontal direction between centers of two neighboring components among components having a regular arrangement.

Hereinafter, various embodiments of the present disclosure are described with reference to the accompanying drawings.

Figure 2:
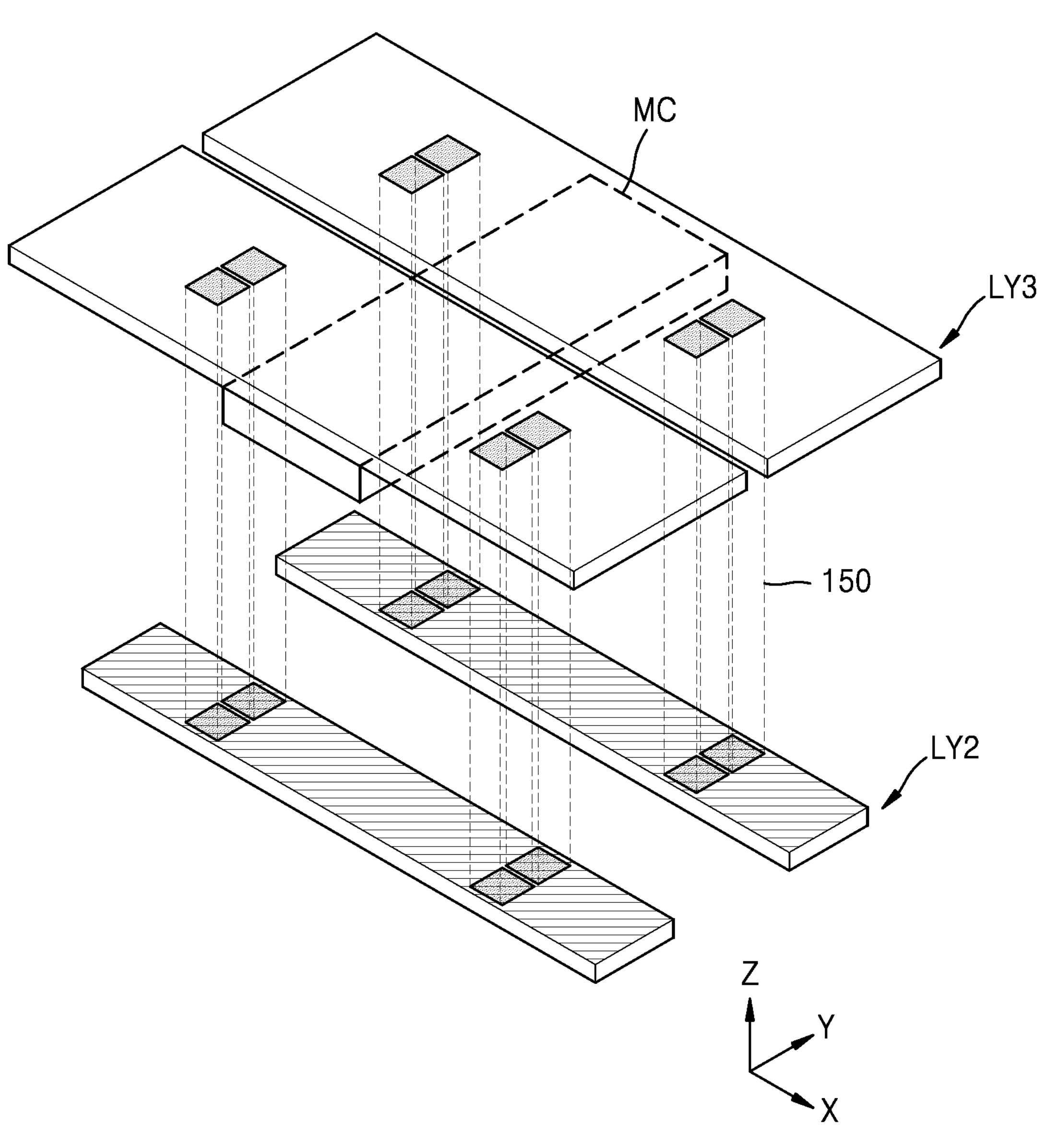
FIG. 2 is a diagram depicting disposition of a plurality of through structures and a macro cell included in a semiconductor package, according to some embodiments.

FIG. 1 is a cross-sectional view illustrating a semiconductor package 10 according to some embodiments. FIG. 2 is a diagram depicting disposition of a plurality of through structures 150 and a macro cell MC included in the semiconductor package 10, according to some embodiments.

Referring to FIG. 1, the semiconductor package 10 may include a first semiconductor chip 100, a plurality of external connection terminals 310 attached to a lower surface of the first semiconductor chip 100, a second semiconductor chip 200 stacked on the first semiconductor chip 100, and a plurality of connection bumps 330 disposed between the first semiconductor chip 100 and the second semiconductor chip 200.

The plurality of external connection terminals 310 may electrically and/or physically connect (couple) the semiconductor package 10 to an external device. For example, the plurality of external connection terminals 310 may electrically and/or physically connect a semiconductor package substrate to the semiconductor package 10. The plurality of external connection terminals 310 may be attached to the lower surface of the first semiconductor chip 100 and may be arranged in a first horizontal direction (X direction) and a second horizontal direction (Y direction) on the lower surface of the first semiconductor chip 100. The plurality of external connection terminals 310 may be formed from a solder ball and may include solder.

The plurality of external connection terminals 310 may include input/output signal terminals configured to transfer input/output signals (e.g., input/output data signals, control signals, and the like) between the first and second semiconductor chips 100 and 200 and the external device. The plurality of external connection terminals 310 may further include power terminals for supplying power to elements of the first and second semiconductor chips 100 and 200. The power terminals of the plurality of external connection terminals 310 may include a plurality of first power external connection terminals configured to receive first power signals supplied to the elements of the first semiconductor chip 100, and a plurality of second power external connection terminals configured to receive second power signals supplied to the elements of the second semiconductor chip 200. Each of the first power signal and the second power signal may include, for example, a first supply voltage (e.g., a positive power supply voltage) and/or a second supply voltage (e.g., a ground voltage and/or a negative power supply voltage).

In some embodiments, each of the first semiconductor chip 100 and the second semiconductor chip 200 may include a logic chip and/or a memory chip. In an embodiment, the first semiconductor chip 100 may include the macro cell MC and may include, for example, a memory chip, such as static random access memory (SRAM), and/or a logic chip in which a logic circuit is implemented. The logic chip may include, but not be limited to, a central processing unit (CPU) chip, a graphics processing unit (GPU) chip, an application processor (AP) chip, an application specific integrated circuit (ASIC) chip, and the like. The memory chip may include, but not be limited to, a dynamic random access memory (DRAM) chip, an SRAM chip, a flash memory chip, an electrically erasable and programmable read-only memory (EEPROM) chip, a phase-change random access memory (PRAM) chip, a magnetic random access memory (MRAM) chip, a resistive random access memory (RRAM) chip, and the like. The first semiconductor chip 100 and the second semiconductor chip 200 may be and/or may include semiconductor chips of the same type and/or semiconductor chips of different types.

The first semiconductor chip 100 may include a first substrate 110, a plurality of through structures 150, a first device layer 120, a first lower wiring structure 130, and a first upper wiring structure 140. The through structure 150 may be referred to as a through electrode.

The first substrate 110 may include a first surface 111 and a second surface 113 that may be opposite to each other. For example, the first surface 111 may be and/or may include an active surface of the first substrate 110 and the second surface 113 may be and/or may include an inactive surface of the first substrate 110. In an embodiment, the first surface 111 may be disposed to face the plurality of external connection terminals 310 and the second surface 113 may be disposed to face the second semiconductor chip 200. In an embodiment, the semiconductor package 10 may be disposed such that the first surface 111, which may be the active surface of the first semiconductor chip 100, and an active surface of the second semiconductor chip 200 do not face each other (e.g., face back-to-back). Accordingly, in the semiconductor package 10 of FIG. 1, the first surface 111 may be referred to as a lower surface of the first substrate 110 and the second surface 113 may be referred to as an upper surface of the first substrate 110.

The first substrate 110 may be and/or may include a semiconductor substrate. The first substrate 110 may include, for example, silicon (Si). Alternatively or additionally, the first substrate 110 may include a semiconductor element such as, but not limited to, germanium (Ge) and/or a compound semiconductor such as, but not limited to, silicon carbide (SiC), gallium arsenide (GaAs), indium arsenide (InAs), and indium phosphide (InP). The first substrate 110 may include a conductive area that may include, for example, a well doped with impurities and/or a structure doped with impurities. Alternatively or additionally, the first substrate 110 may have various device isolation structures such as, but not limited to, a shallow trench isolation (STI) structure.

The plurality of through structures 150 may vertically penetrate the first substrate 110. That is, each through structure of the plurality of through structures 150 may be provided in a through hole of the first substrate 110, and a via insulating layer may be disposed between each through structure 150 and the first substrate 110. Each through structure of the plurality of through structures 150 may be electrically insulated from the first substrate 110 by the via insulating layer. For example, each through structure of the plurality of through structures 150 may include a column-shaped conductive plug and a conductive barrier layer surrounding a sidewall of the conductive plug.

The first device layer 120 may be disposed below the first substrate 110. That is, the first device layer 120 may be and/or may include a front end of line (FEOL) structure formed on the first surface 111 that may be and/or may include the active surface of the first substrate 110. The first device layer 120 may include a first interlayer insulating layer 129 and first individual devices. The first individual devices may be formed in the first substrate 110 and/or on the first surface 111, which may be and/or may include the active surface of the first substrate 110. In an embodiment, an SRAM and/or a logic circuit chip may be disposed on the first device layer 120. The first individual devices may include active devices such as, for example, transistors. The first individual devices may include microelectronic devices such as, for example, metal-oxide-semiconductor field effect transistors (MOSFETs), large scale integration (LSIs), image sensors such as CMOS imaging sensors (CISs), micro-electro-mechanical systems (MEMSs), active devices, passive devices, and the like.

The first individual devices may be electrically connected to a conductive area of the first substrate 110. Each of the first individual devices may be electrically separated from the other neighboring first individual devices by the first interlayer insulating layer 129. The first device layer 120 may include a plurality of first conductive via patterns 121 vertically penetrating the first interlayer insulating layer 129 and electrically connected to the plurality of through structures 150, respectively. However, in some embodiments, the plurality of through structures 150 may be formed to penetrate both the first substrate 110 and the first interlayer insulating layer 129 and to contact a second wiring layer LY2 of the first lower wiring structure 130 (not shown).

The first lower wiring structure 130 may be disposed below the first device layer 120. The first lower wiring structure 130 may be and/or may include a back end of line (BEOL) structure. The first lower wiring structure 130 may include a first lower insulating layer 139 and wiring layers of a multilayer structure that may be disposed at different vertical levels within the first lower insulating layer 139. The wiring layers of the multilayer structure may be electrically connected to each other through a plurality of conductive via patterns extending in the vertical direction within the first lower insulating layer 139.

The first lower wiring structure 130 may include a pad wiring layer 131, a first wiring layer LY1, and the second wiring layer LY2 that may be disposed at different vertical levels. A rail for providing power to the first semiconductor chip 100 and the second semiconductor chip 200 may be disposed in the first lower wiring structure 130. For example, wiring patterns of the second wiring layer LY2 may be and/or may include rails. In the first lower wiring structure 130, the pad wiring layer 131 may be a lowermost wiring layer and the second wiring layer LY2 may be an uppermost wiring layer.

The pad wiring layer 131 may be provided on a lower surface of the first lower wiring structure 130. The pad wiring layer 131 may include a plurality of external connection pads respectively coupled to the plurality of external connection terminals 310. A lower surface of an individual external connection pad may not be covered by the first lower insulating layer 139, and an individual external connection terminal 310 corresponding thereto may be attached to the lower surface of an individual external connection pad. The plurality of external connection pads may be arranged in the first horizontal direction (X direction) and the second horizontal direction (Y direction). A layout of the plurality of external connection pads may be substantially similar and/or the same as a layout of the plurality of external connection terminals 310. Pitch distances of the plurality of external connection pads in the first horizontal direction (X direction) and in the second horizontal direction (Y direction) may be substantially similar and/or the same as pitch distances of the plurality of external connection terminals 310 in the first horizontal direction (X direction) and in the second horizontal direction (Y direction), respectively.

The first wiring layer LY1 may be disposed on the pad wiring layer 131. The first wiring layer LY1 may include a plurality of conductive patterns. The conductive patterns of the plurality of conductive patterns may be spaced apart from each other. Each of the plurality of conductive patterns may have a line shape extending in the horizontal direction.

The first wiring layer LY1 may include a plurality of first conductive patterns electrically connected to a plurality of first power external connection terminals receiving the first power signals and a plurality of second conductive patterns electrically connected to a plurality of second power external connection terminals receiving the second power signals. In an embodiment, the plurality of first conductive patterns of the first wiring layer LY1 may be spaced apart from each other in the first horizontal direction (X direction) and each of the plurality of first conductive patterns may have a line shape extending in the second horizontal direction (Y direction). In an optional or additional embodiment, the plurality of second conductive patterns of the first wiring layer LY1 may be spaced apart from each other in the first horizontal direction (X direction) and each of the plurality of second conductive patterns may have a line shape extending in the second horizontal direction (Y direction).

Figure 3:
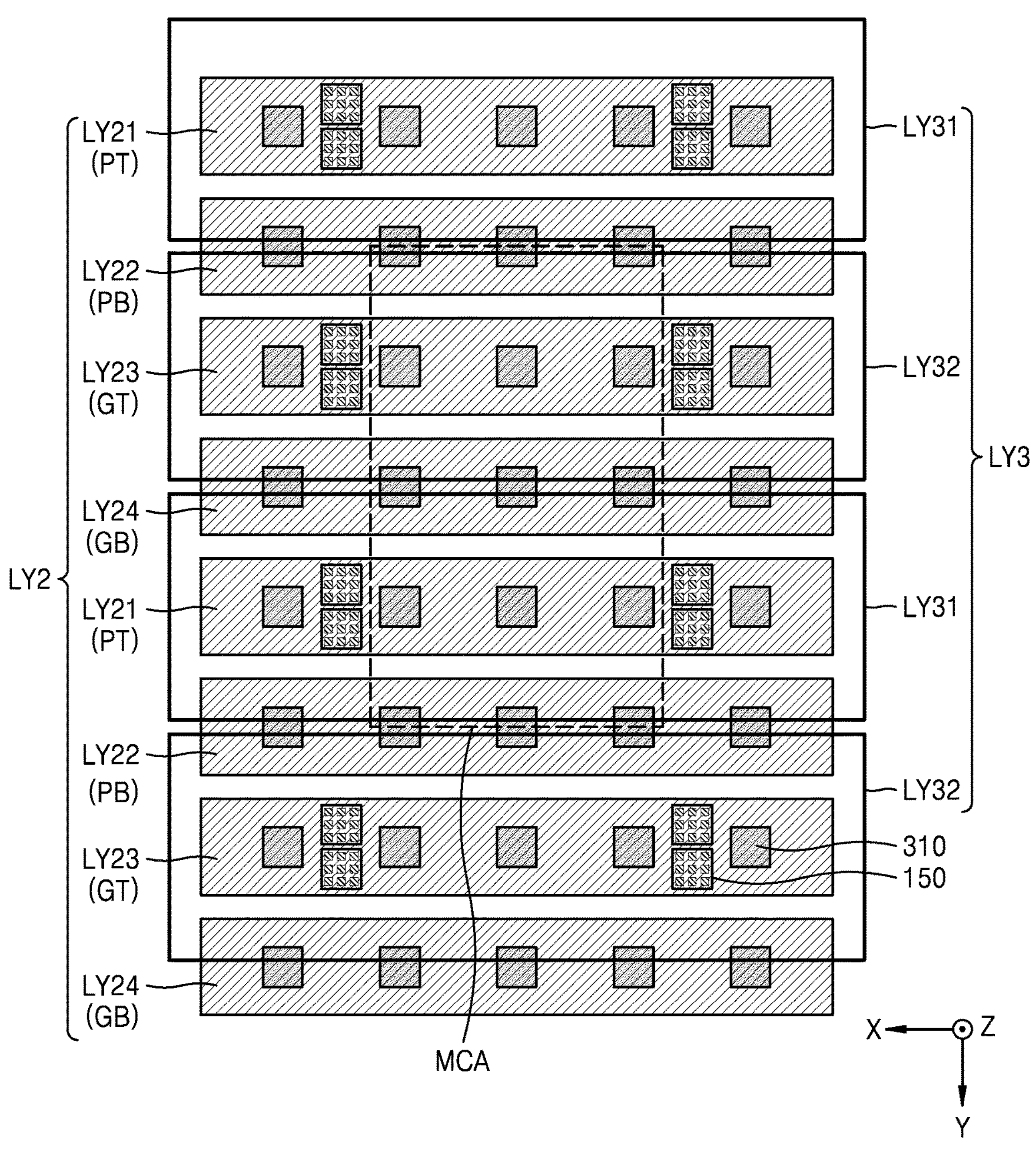
FIG. 3 is a plan view illustrating a part of a first semiconductor chip included in a semiconductor package, according to some embodiments.

The second wiring layer LY2 may be disposed on the first wiring layer LY1. The second wiring layer LY2 may function and/or perform as a plurality of power delivery networks (PDNs). The second wiring layer LY2 may include a plurality of wiring patterns extending in the horizontal direction from a lower portion of the first surface 111 of the first substrate 110. For example, as shown in FIG. 3, the second wiring layer LY2 may include a plurality of first wiring patterns LY21, a plurality of second wiring patterns LY22, a plurality of third wiring patterns LY23, and a plurality of fourth wiring patterns LY24. The plurality of first to fourth wiring patterns LY21 to LY24 may be configured to transmit power signals of the same potential and may be and/or may include line patterns spaced apart from each other in the horizontal direction (e.g., in the second horizontal direction (Y direction)) and extending in the horizontal direction (e.g., in the first horizontal direction (X direction)). In an embodiment, a line width of each of the plurality of first to fourth wiring patterns LY21 to LY24 included in the second wiring layer LY2 may be less than a line width of an individual conductive pattern included in the first wiring layer LY1.

The first upper wiring structure 140 may be disposed on the first substrate 110. The first upper wiring structure 140 may include a redistribution structure formed on the second surface 113, which may be the inactive surface of the first substrate 110. The first upper wiring structure 140 may include an upper insulating layer 149 and wiring layers having a multilayer structure disposed at different vertical levels within the upper insulating layer 149. The wiring layers of the multilayer structure may be electrically connected to each other through a plurality of conductive via patterns extending in the vertical direction within the upper insulating layer 149.

The first upper wiring structure 140 may include a third wiring layer LY3 and a pad wiring layer 145 disposed at different vertical levels. In the first upper wiring structure 140, the third wiring layer LY3 may be a lowermost wiring layer and the pad wiring layer 145 may be an uppermost wiring layer.

The third wiring layer LY3 may be and/or may include a plurality of wiring patterns extending on the second surface 113 of the first substrate 110. For example, the third wiring layer LY3 may include a plurality of first wiring patterns (e.g., LY31 in FIG. 3) and a plurality of second wiring patterns (e.g., LY32 in FIG. 3). The plurality of first wiring patterns LY31 and the plurality of second wiring patterns LY32 may be configured to transmit power signals of the same potential and may be and/or may include line patterns spaced apart from each other in the horizontal direction (e.g., in the second horizontal direction (Y direction)) and extending in the horizontal direction (e.g., the first horizontal direction (X direction)). In an embodiment, each of the plurality of first wiring patterns LY31 and the plurality of second wiring patterns LY32 may have a line width that may be greater than a line width of an individual conductive pattern of the first wiring layer LY1.

The wiring patterns of the third wiring layer LY3 may be configured to receive the second power signal used in the second semiconductor chip 200. The wiring patterns of the third wiring layer LY3 may be electrically connected to the wiring patterns of the second wiring layer LY2 corresponding thereto through the plurality of through structures 150. With respect to the plurality of through structures 150, the second wiring layer LY2 may be referred to as a lower wiring layer, and the third wiring layer LY3 may be referred to as an upper wiring layer. In an embodiment, the plurality of through structures 150 may contact the third wiring layer LY3.

Referring to FIGS. 1 and 2, the wiring patterns of the second wiring layer LY2 and the wiring patterns of the third wiring layer LY3 may be electrically connected to each other through the plurality of through structures 150. With respect to an XY plane of the first semiconductor chip 100, the macro cell MC may be disposed in an area where the plurality of through structures 150 may not be disposed. In the semiconductor package 10 including the first semiconductor chip 100, according to the present disclosure, an arrangement distance between the plurality of through structures 150 may be set to facilitate the arrangement of the macro cell MC. Accordingly, the number of times of performing a redesign operation by adjusting the size of the macro cell MC may be reduced by adjusting the arrangement distance between the plurality of through structures 150, and a turnaround time (TAT) needed to design and/or manufacture the semiconductor package 10 including the first semiconductor chip 100 may be reduced.

Referring back to FIG. 1, the pad wiring layer 145 may be provided on an upper surface of the first upper wiring structure 140. The pad wiring layer 145 may be and/or may include a plurality of connection pads respectively coupled to the plurality of connection bumps 330. Each of the plurality of connection pads of the pad wiring layer 145 may be connected to a corresponding wiring pattern among the wiring patterns of the third wiring layer LY3 through the conductive via pattern provided in the upper insulating layer 149. The plurality of connection bumps 330 may include, for example, solders. However, the present disclosure is not limited in this regard.

The second semiconductor chip 200 may include a second substrate 210, a second device layer 220, and a second lower wiring structure 230.

The second substrate 210 may include a first surface 221 and a second surface 213 opposite to each other. The first surface 221 of the second substrate 210 may be and/or may include an active surface and may correspond to a lower surface of the second substrate 210 facing the first semiconductor chip 100. The second surface 213 of the second substrate 210 may be and/or may include an inactive surface and may correspond to an upper surface of the second substrate 210. A material of the second substrate 210 may be substantially the same as and/or similar to a material of the first substrate 110. The second substrate 210 may include a conductive area that may include, for example, a well doped with impurities and/or a structure doped with impurities. Alternatively or additionally, the second substrate 210 may have various device isolation structures such as, but not limited to, an STI structure.

The second device layer 220 may be disposed below the second substrate 210. That is, the second device layer 220 may include an FEOL structure formed on the active surface of the second substrate 210. The second device layer 220 may include a second interlayer insulating layer 229 and second individual devices. The second individual devices may be formed within the second substrate 210 and/or on the active surface of the second substrate 210. The second individual devices may include active devices such as, but not limited to, transistors and the like. The second individual devices may be electrically connected to the conductive area of the second substrate 210. Each of the second individual devices may be electrically separated from the other neighboring second individual devices by the second interlayer insulating layer 229.

The second lower wiring structure 230 may be disposed below the second device layer 220. The second lower wiring structure 230 may include a BEOL structure. The second lower wiring structure 230 may include a second lower insulating layer 239 and wiring layers of a multilayer structure that may be disposed at different vertical levels within the second lower insulating layer 239. The wiring layers of the multilayer structure may be electrically connected to each other through a plurality of conductive via patterns extending in the vertical direction within the second lower insulating layer 239.

The second lower wiring structure 230 may include a fourth wiring layer LY4 provided on a lower surface of the second lower wiring structure 230. The fourth wiring layer LY4 may include a plurality of bump pads 441 and a plurality of test pads 445. Lower surfaces of the plurality of bump pads 441 may not be covered by the second lower insulating layer 239, and the plurality of bump pads 441 may be respectively coupled to the connection bumps 330. Lower surfaces of the plurality of test pads 445 may not be covered by the second lower insulating layer 239 and/or may be exposed through a gap between the first semiconductor chip 100 and the second semiconductor chip 200. The plurality of test pads 445 may be spaced apart from the plurality of bump pads 441 and the plurality of connection bumps 330 along a lower surface of the second lower insulating layer 239. The plurality of bump pads 441 may be regularly arranged in the first horizontal direction (X direction) and the second horizontal direction (Y direction), and the plurality of test pads 445 may be arranged in the first horizontal direction (X direction) and in the second horizontal direction (Y direction). A layout of the plurality of bump pads 441 may be substantially similar and/or the same as a layout of the plurality of connection bumps 330. Pitch distances of the plurality of bump pads 441 in the first horizontal direction (X direction) and in the second horizontal direction (Y direction) may be respectively substantially similar and/or the same as pitch distances of the plurality of connection bumps 330 in the first horizontal direction (X direction) and in the second horizontal direction (Y direction).

The plurality of test pads 445 may be and/or may include pads for electrical test of the second semiconductor chip 200. A test operation of inspecting the electrical performance of the second semiconductor chip 200 by contacting a test probe with the test pad 445 of the second semiconductor chip 200 may be performed before mounting the second semiconductor chip 200 on the first semiconductor chip 100. In an embodiment, the second semiconductor chip 200 determined to be a good product in the test operation may be mounted on the first semiconductor chip 100.

In the semiconductor package 10, the first semiconductor chip 100 and the second semiconductor chip 200 may be configured to receive power signals through different electrical paths. The first semiconductor chip 100 may be configured to receive the first power signals (e.g., a first supply voltage and a second supply voltage) through an electrical path including the plurality of external connection terminals 310, the plurality of conductive patterns of the first wiring layer LY1, and the plurality of wiring patterns of the second wiring layer LY2. That is, the plurality of external connection terminals 310, the plurality of conductive patterns of the first wiring layer LY1, and the plurality of wiring patterns of the second wiring layer LY2 may function and/or perform as a PDN with respect to the first semiconductor chip 100.

The second semiconductor chip 200 may be configured to receive the second power signals (e.g., a first supply voltage and a second supply voltage) through the electrical paths including the plurality of external connection terminals 310, the plurality of conductive patterns of the first wiring layer LY1, the plurality of wiring patterns of the second wiring layer LY2, the plurality of through structures 150, the plurality of wiring patterns of the third wiring layer LY3, the plurality of connection bumps 330, and the plurality of bump pads 441 of the fourth wiring layer LY4. That is, the plurality of external connection terminals 310, the plurality of conductive patterns of the first wiring layer LY1, the plurality of wiring patterns of the second wiring layer LY2, the plurality of through structures 150, the plurality of wiring patterns of the third wiring layer LY3, the plurality of connection bumps 330, and the plurality of bump pads 441 of the fourth wiring layer LY4 may function and/or perform as a PDN with respect to the second semiconductor chip 200.

According to a ratio between the power consumption of the first semiconductor chip 100 and the power consumption of the second semiconductor chip 200, a ratio between a density of a conductive element functioning and/or performing as the PDN with respect to the first semiconductor chip 100 and a density of a conductive element functioning and/or performing as the PDN with respect to the second semiconductor chip 200 may be determined. As used herein, the density of a conductive element may refer to a ratio of an area of the conductive element on a horizontal plane (XY plane) to an area of the horizontal plane.

Figure 4:
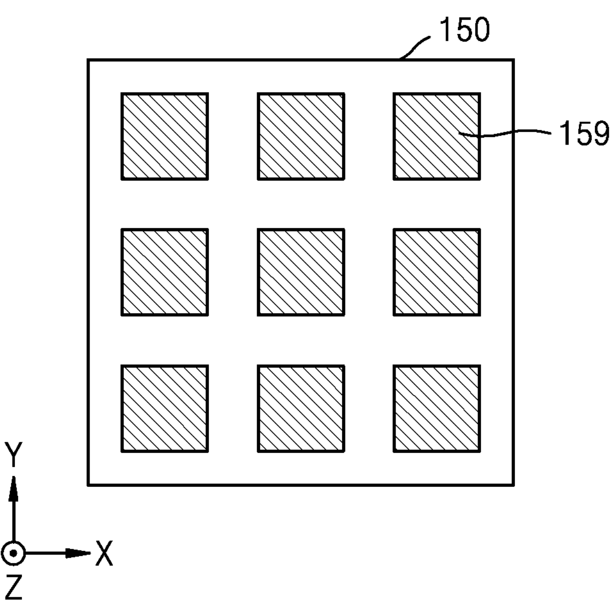
FIG. 4 is a plan view depicting a through structure of a first semiconductor chip included in a semiconductor package, according to some embodiments.

FIG. 3 is a plan view illustrating a part of the first semiconductor chip 100 included in the semiconductor package 10, according to some embodiments. FIG. 4 is a plan view depicting the through structure 150 of the first semiconductor chip 100 included in the semiconductor package 10, according to some embodiments. In FIGS. 3 and 4, cross-sections of the plurality of external connection terminals 310 and the plurality of through structures 150 are respectively illustrated in a square shape. However, it may be understood that the illustrated shape of these elements is for example only and is not intended to limit the present disclosure. That is, the shape of the cross-section is not limited thereto and may be modified in various ways.

Referring to FIGS. 1 and 3, the second wiring layer LY2 may be disposed on a lower portion of the first surface 111 of the first substrate 110. The second wiring layer LY2 may include a plurality of wiring patterns. For example, the second wiring layer LY2 may include the plurality of first wiring patterns LY21, the plurality of second wiring patterns LY22, the plurality of third wiring patterns LY23, and the plurality of fourth wiring patterns LY24. The plurality of first to fourth wiring patterns LY21 to LY24 may be and/or may include line patterns spaced apart in the second horizontal direction (Y axis) and extending in the first horizontal direction (X axis). In an embodiment, the first wiring pattern LY21, the second wiring pattern LY22, the third wiring pattern LY23, and the fourth wiring pattern LY24 may be sequentially disposed in the second horizontal direction (Y axis), and may be repeatedly disposed in the second horizontal direction (Y axis) in the order of the first wiring pattern LY21, the second wiring pattern LY22, the third wiring pattern LY23, and the fourth wiring pattern LY24.

The plurality of first wiring patterns LY21, the plurality of second wiring patterns LY22, the plurality of third wiring patterns LY23, and the plurality of fourth wiring patterns LY24 of the second wiring layer LY2 may be electrically connected to the plurality of external connection terminals 310 respectively corresponding thereto. For example, the plurality of external connection terminals 310 that may be electrically connected to wiring patterns of the second wiring layer LY2 may be disposed to overlap with the wiring patterns of the second wiring layer LY2 in the vertical direction (Z axis). That is, the plurality of external connection terminals 310 electrically connected to the plurality of first wiring patterns LY21 may be disposed in lower portions of the plurality of first wiring patterns LY21 in the vertical direction (Z axis), and may be disposed to have a constant pitch distance in the first horizontal direction (X axis), which may be a direction in which the plurality of first wiring patterns LY21 may extend. Alternatively or additionally, the plurality of external connection terminals 310 that may be electrically connected to the plurality of second wiring patterns LY22 may be disposed in lower portions of the plurality of second wiring patterns LY22 in the vertical direction (Z axis), and may be disposed to have a constant pitch distance in the first horizontal direction (X axis), which may be a direction in which the plurality of second wiring patterns LY22 may extend. As another example, the plurality of external connection terminals 310 that may be electrically connected to the plurality of third wiring patterns LY23 may be disposed in lower portions of the plurality of third wiring patterns LY23 in the vertical direction (Z axis), and may be disposed to have a constant pitch distance in the first horizontal direction (X axis), which may be a direction in which the plurality of third wiring patterns LY23 may extend. As another example, the plurality of external connection terminals 310 that may be electrically connected to the plurality of fourth wiring patterns LY24 may be disposed in lower portions of the plurality of fourth wiring patterns LY24 in the vertical direction (Z axis), and may be disposed to have a constant pitch distance in the first horizontal direction (X axis), which may be a direction in which the plurality of fourth wiring patterns LY24 may extend.

The plurality of first wiring patterns LY21 and the plurality of third wiring patterns LY23 of the second wiring layer LY2 may be wiring patterns for providing a second power signal to the second semiconductor chip 200. The plurality of first wiring patterns LY21 may be wiring patterns for providing a first supply voltage PT supplied to the second semiconductor chip 200. The plurality of external connection terminals 310 disposed in the lower portions of the plurality of first wiring patterns LY21 may be external connection terminals providing the first supply voltage PT to the semiconductor package 10. Alternatively or additionally, the plurality of third wiring patterns LY23 may be wiring patterns for providing a second supply voltage GT supplied to the second semiconductor chip 200, and the plurality of external connection terminals 310 disposed in the lower portions of the plurality of third wiring patterns LY23 may be external connection terminals providing the second supply voltage GT supplied to the second semiconductor chip 200 to the semiconductor package 10. For example, the first supply voltage PT may be a positive power supply voltage and the second supply voltage GT may be a ground voltage. However, the first supply voltage PT and the second supply voltage GT are not limited thereto.

The plurality of second wiring patterns LY22 and the plurality of fourth wiring patterns LY24 of the second wiring layer LY2 may be and/or may include wiring patterns for providing a first power signal to the first semiconductor chip 100. The plurality of second wiring patterns LY22 may be and/or may include wiring patterns for providing a first supply voltage PB supplied to the first semiconductor chip 100. The plurality of external connection terminals 310 that may be disposed in the lower portions of the plurality of second wiring patterns LY22 may be and/or may include external connection terminals providing the first supply voltage PB to the semiconductor package 10. The plurality of fourth wiring patterns LY24 may be and/or may include wiring patterns for providing a second supply voltage GB supplied to the first semiconductor chip 100. The plurality of external connection terminals 310 that may be disposed in the lower portions of the plurality of fourth wiring patterns LY24 may be and/or may include external connection terminals providing the second supply voltage GB supplied to the first semiconductor chip 100 to the semiconductor package 10. For example, the first supply voltage PB may be a positive power supply voltage and the second supply voltage GB may be a ground voltage. However, the first supply voltage PB and the second supply voltage GB are not limited thereto.

The plurality of through structures 150 electrically connected to wiring patterns of the second wiring layer LY2 may be disposed to overlap with the wiring patterns of the second wiring layer LY2 in the vertical direction (Z axis). For example, the plurality of through structures 150 electrically connected to the plurality of first wiring patterns LY21 may be disposed in upper portions of the plurality of first wiring patterns LY21 in the vertical direction (Z axis), and may be disposed to have a constant pitch distance in the first horizontal direction (X axis), which may be the direction in which the plurality of first wiring patterns LY21 may extend. Alternatively or additionally, the plurality of through structures 150 electrically connected to the plurality of third wiring patterns LY23 may be disposed in upper portions of the plurality of third wiring patterns LY23 in the vertical direction (Z axis), and may be disposed to have a constant pitch distance in the first horizontal direction (X axis), which may be the direction in which the plurality of third wiring patterns LY23 may extend. In some embodiments, the plurality of through structures 150 may be disposed to deviate from the plurality of second wiring patterns LY22 and the plurality of fourth wiring patterns LY24 in the vertical direction (Z axis).

Referring to FIGS. 3 and 4, each of the plurality of through structures 150 may be configured as a bundle of a plurality of sub-through structures 159. The plurality of sub-through structures 159 of one through structure 150 may be configured to transmit power of a substantially similar and/or the same potential. Although FIG. 4 shows one through structure 150 as including nine (9) sub-through structures 159 and cross-sections of the sub-through structures 159 as having a square shape, the present disclosure is not limited thereto. That is, the number of sub-through structures 159 included in one through structure 150 may be modified in various ways, and the shape of the cross-sections of the sub-through structures 159 may also be modified in various ways.

Referring back to FIG. 3, the third wiring layer LY3 may be disposed in an upper portion of the second surface 113 of the first substrate 110. The third wiring layer LY3 may include a plurality of wiring patterns. For example, the third wiring layer LY3 may include the plurality of first wiring patterns LY31 and the plurality of second wiring patterns LY32. The plurality of first wiring patterns LY31 and the plurality of second wiring patterns LY32 may extend in the first horizontal direction (X axis), and may be spaced apart from each other in the second horizontal direction (Y axis). In an embodiment, the first wiring patterns LY31 and the second wiring patterns LY32 may be alternately disposed.

The plurality of first wiring patterns LY31 of the third wiring layer LY3 electrically connected to the plurality of first wiring patterns LY21 of the second wiring layer LY2 may be disposed to overlap (and/or align) with the plurality of first wiring patterns LY21 in the vertical direction (Z axis). The plurality of first wiring patterns LY21 of the second wiring layer LY2 may be electrically connected to the plurality of first wiring patterns LY31 of the third wiring layer LY3 through the plurality of through structures 150 disposed in the upper portions thereof in the vertical direction (Z axis). Accordingly, the plurality of first wiring patterns LY21 of the second wiring layer LY2, the plurality of first wiring patterns LY31 of the third wiring layer LY3, and the plurality of through structures 150 disposed therebetween may function and/or perform as a PDN for providing the first supply voltage PT.

The plurality of second wiring patterns LY32 of the third wiring layer LY3 electrically connected to the plurality of third wiring patterns LY23 of the second wiring layer LY2 may be disposed to overlap with the plurality of third wiring patterns LY23 in the vertical direction (Z axis). The plurality of third wiring patterns LY23 of the second wiring layer LY2 may be electrically connected to the plurality of second wiring patterns LY32 of the third wiring layer LY3 through the plurality of through structures 150 disposed in the upper portions thereof in the vertical direction (Z axis). Therefore, the plurality of third wiring patterns LY23 of the second wiring layer LY2, the plurality of second wiring patterns LY32 of the third wiring layer LY3, and the plurality of through structures 150 disposed therebetween may function and/or perform as a PDN for providing the second supply voltage GT.

A macro cell area MCA, in which the macro cell MC may be disposed, may be formed in an area where the plurality of through structures 150 may not be disposed. The size of the macro cell area MCA may vary according to a pitch distance between the plurality of through structures 150 in the first horizontal direction (X axis).

Figure 5:
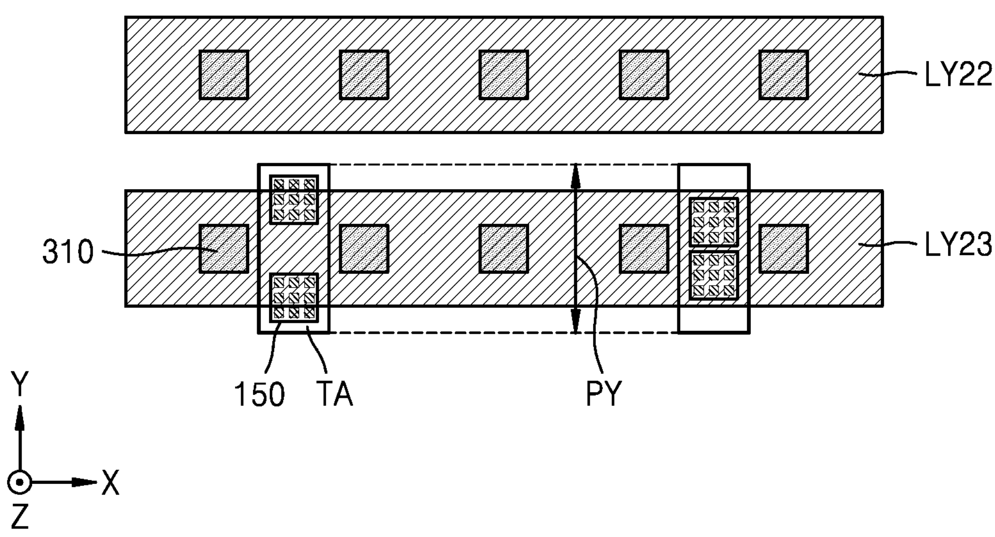
FIG. 5 is a plan view illustrating a part of a first semiconductor chip included in a semiconductor package, according to some embodiments.

FIG. 5 is a plan view illustrating a part of the first semiconductor chip 100 included in the semiconductor package 10, according to some embodiments.

Referring to FIG. 5, a disposition available area TA in which the plurality of through structures 150 may be disposed may be set. The disposition available area TA may be formed so as not to overlap with the plurality of external connection terminals 310 in the vertical direction (Z axis). That is, the disposition available area TA may be formed between two external connection terminals 310 adjacently disposed in the first horizontal direction (X axis). The plurality of through structures 150 may be disposed within the disposition available area TA in the second horizontal direction (Y axis). For example, two through structures 150 may be disposed within the disposition available area TA in the second horizontal direction (Y axis).

The wiring patterns of the second wiring layer LY2 may be spaced apart from each other to have a pitch distance (e.g., first pitch distance PY1 in FIG. 7) in the second horizontal direction (Y axis). A width PY of the disposition available area TA in the second horizontal direction (Y axis) may be substantially similar and/or the same as the first pitch distance PY1 between the wiring patterns of the second wiring layer LY2. For example, the disposition available area TA may have a width half the first pitch distance PY1 in the second horizontal direction (Y axis) from the center of the wiring patterns (e.g., the third wiring patterns LY23) of the second wiring layer LY2, and may have a width that may be half of the first pitch distance PY1 in a direction opposite to the second horizontal direction (Y axis) from the center of the wiring patterns (e.g., the third wiring patterns LY23) of the second wiring layer LY2. In an embodiment, at least one through structure 150 overlapping in the vertical direction (Z axis) may be disposed within a distance half of the first pitch distance PY1 in the second horizontal direction (Y axis) from the center of the wiring patterns (e.g., the third wiring patterns LY23) of the second wiring layer LY2, and at least one through structure 150 overlapping in the vertical direction (Z axis) may be disposed within a distance half of the first pitch distance PY1 in the direction opposite to the second horizontal direction (Y axis) from the center of the wiring patterns (e.g., the third wiring patterns LY23) of the second wiring layer LY2.

The plurality of through structures 150 may be disposed to overlap the wiring patterns of the second wiring layer LY2 (e.g., the first wiring patterns LY21 and/or the third wiring patterns LY23 in FIG. 3) in the vertical direction within the disposition available area TA. For example, the plurality of through structures 150 disposed within the disposition available area TA may be disposed inside of a width (e.g., first width W1 in FIG. 7) of the third wiring patterns LY23 in the second horizontal direction (Y axis) on the XY plane. That is, the plurality of through structures 150 may be aligned with the third wiring patterns LY23 on the XY plane. Alternatively or additionally, the plurality of through structures 150 disposed within the disposition available area TA may be disposed to partly overlap with the third wiring patterns LY23 even if deviating from the first width W1 of the third wiring patterns LY23 in the second horizontal direction (Y axis) on the XY plane.

Figure 6A:
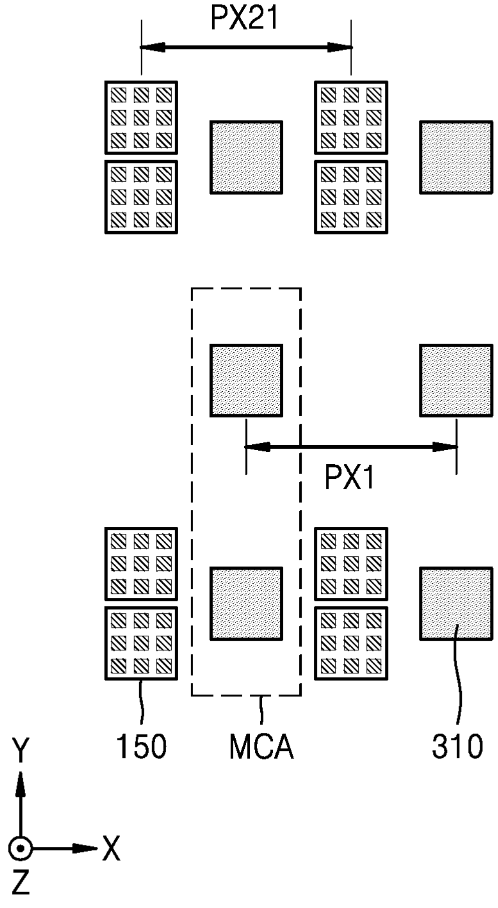
FIGS. 6A to 6C are plan views depicting disposition relationships between through structures and external connection terminals included in a semiconductor package, according to some embodiments.
Figure 6B:
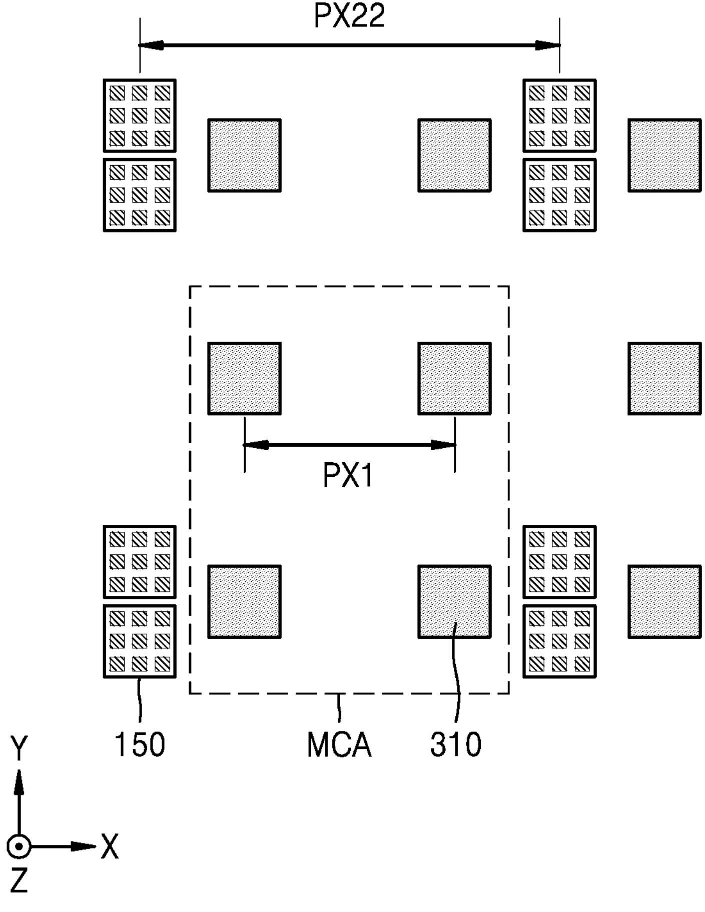
Figure 6C:
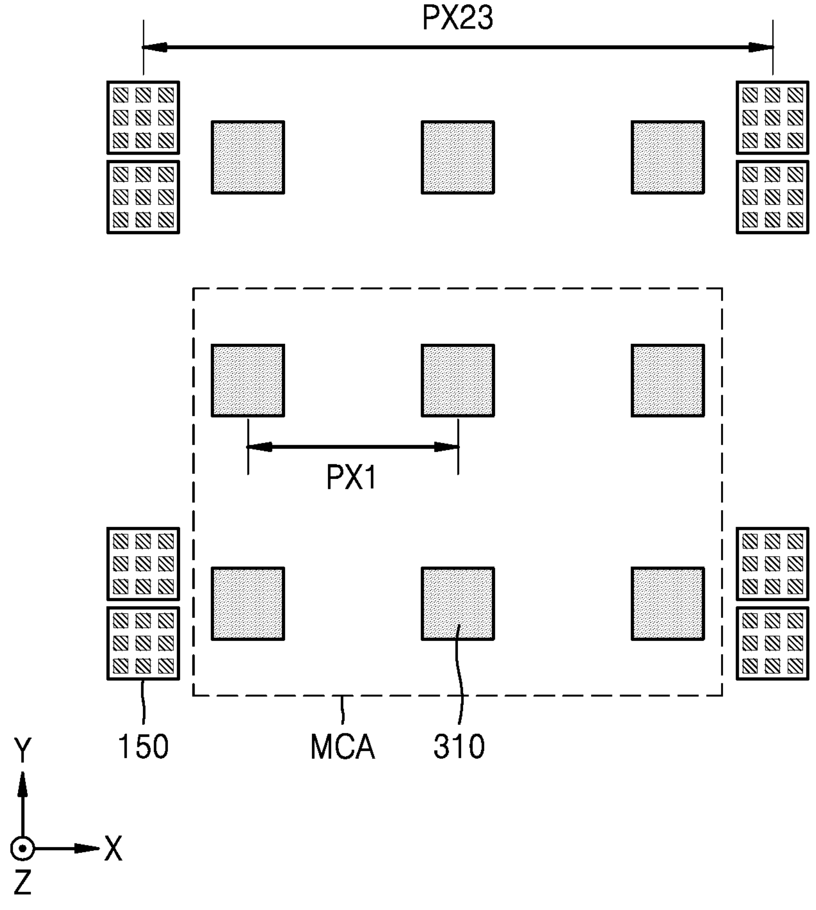

FIGS. 6A to 6C are plan views depicting disposition relationships between the through structures 150 and the external connection terminals 310 included in the semiconductor package 10, according to some embodiments.

Referring to FIGS. 6A to 6C, the plurality of external connection terminals 310 may be disposed to have a first pitch distance PX1 in the first horizontal direction (X axis). In an embodiment, the plurality of external connection terminals 310 may be disposed to have the first pitch distance PX1 in the second horizontal direction (Y axis), but are not limited thereto.

The plurality of through structures 150 may be arranged so as not to overlap with the plurality of external connection terminals 310 in the vertical direction (Z axis). That is, the plurality of through structures 150 may be disposed to deviate from the plurality of external connection terminals 310 in the vertical direction (Z axis), and may be disposed on the XY plane between two external connection terminals 310 disposed adjacent in the first horizontal direction (X axis). In an embodiment, the plurality of through structures 150 may be disposed to have a second pitch distance (e.g., PX21, PX22, and/or PX23) in the first horizontal direction (X axis). The second pitch distances PX21, PX22, and PX23 of the plurality of through structures 150 each may be a multiple value of the first pitch distance PX1 of the plurality of external connection terminals 310, where the multiple factor is a natural number (e.g., a positive integer greater than zero (0). Consequently, the plurality of through structures 150 may be disposed according to such a rule, and thus, current flowing through the plurality of external connection terminals 310 may disperse through the plurality of through structures 150 adjacently disposed to the plurality of external connection terminals 310. In such an embodiment, a current-resistive (IR) drop and/or electromigration (EM) deterioration may be potentially reduced when compared to related semiconductor devices, which may allow for designing the plurality of through structures 150 to have a high pattern density within a limited area.

For example, as shown in FIG. 6A, the plurality of through structures 150 may be disposed to have the second pitch distance PX21 in the first horizontal direction (X axis). In such an embodiment, the second pitch distance PX21 may be substantially similar and/or the same as the first pitch distance PX1.

As another example, as shown in FIG. 6B, the plurality of through structures 150 may be disposed to have the second pitch distance PX22 in the first horizontal direction (X axis). In such an embodiment, the second pitch distance PX22 may be two (2) times the first pitch distance PX1 (e.g., multiple factor of two (2)).

As another example, as shown in FIG. 6C, the plurality of through structures 150 may be disposed to have the second pitch distance PX23 in the first horizontal direction (X axis). In such an embodiment, the second pitch distance PX23 may be three (3) times the first pitch distance PX1 (e.g., multiple factor of three (3)).

In an embodiment, the plurality of through structures 150 may be disposed in the first semiconductor chip 100 of the semiconductor package 10 such that the second pitch distances PX21, PX22, and PX23 each have the value that is the multiple of the first pitch distance PX1 of the plurality of external connection terminals 310, and an area in which the plurality of through structures 150 are not disposed may be set as the macro cell area MCA in which a macro cell may be disposed. In such an embodiment, the plurality of through structures 150 may be disposed such that the second pitch distances PX21, PX22, and PX23 of the plurality of through structures 150 included in the first semiconductor chip 100 may be constant and/or have a value that is a multiple of the first pitch distance PX1. For example, the plurality of through structures 150 may be disposed according to the second pitch distances PX21, PX22, and PX23 described in FIGS. 6A to 6C. Accordingly, the size of the macro cell area MCA may also be configured in various ways, and macro cells of various sizes may be disposed in the first semiconductor chip 100.

Figure 7:
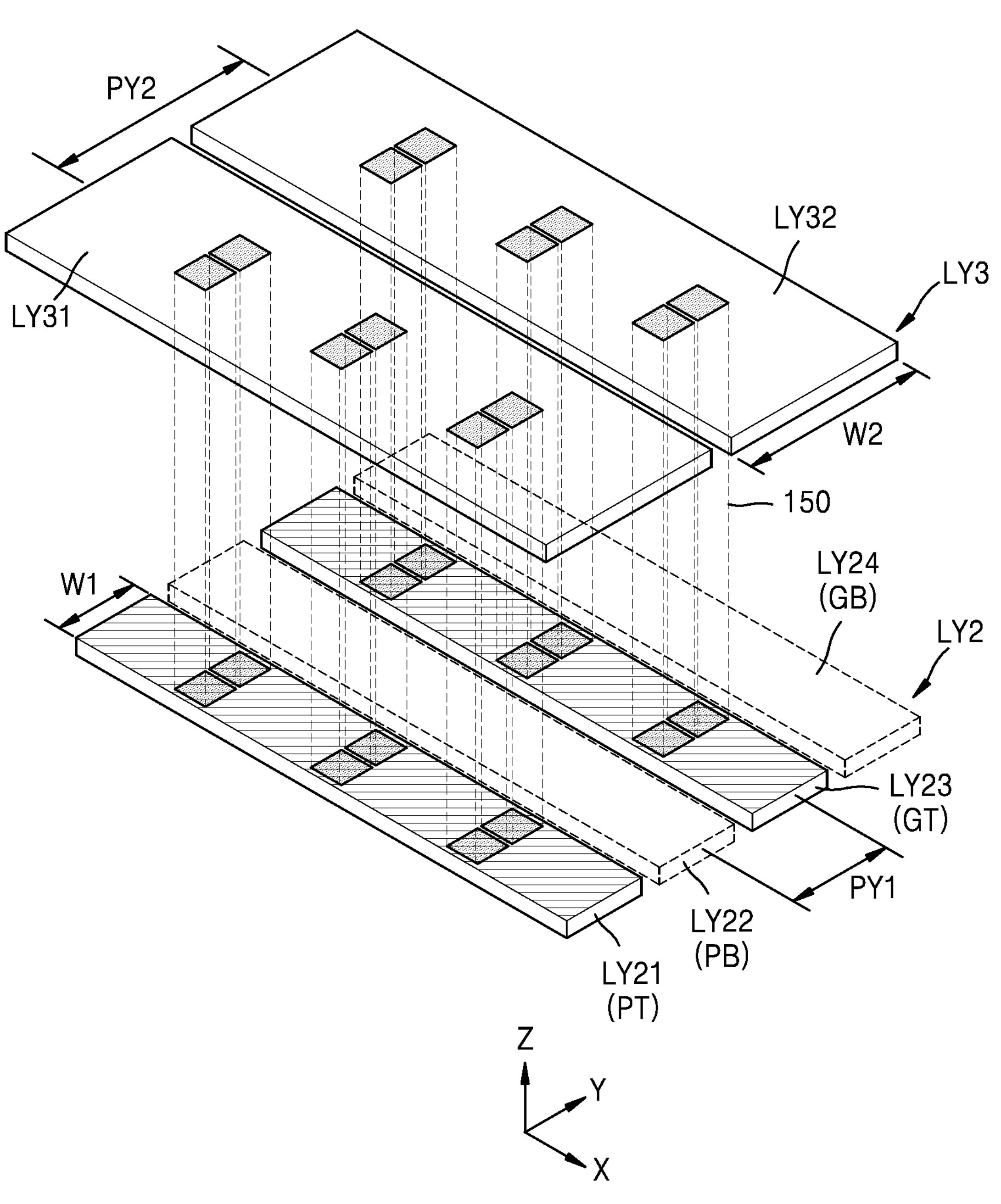
FIG. 7 is a diagram illustrating a second wiring layer, a third wiring layer, and a plurality of through structures included in a semiconductor package, according to some embodiments.

FIG. 7 is a diagram illustrating the second wiring layer LY2, the third wiring layer LY3, and the plurality of through structures 150 included in the semiconductor package 10, according to some embodiments.

Referring to FIG. 7, the second wiring layer LY2 may include a plurality of wiring patterns. For example, the second wiring layer LY2 may include the plurality of first wiring patterns LY21, the plurality of second wiring patterns LY22, the plurality of third wiring patterns LY23, and the plurality of fourth wiring patterns LY24. The plurality of first to fourth wiring patterns LY21 to LY24 may be spaced apart in the second horizontal direction (Y axis) to have the first pitch distance PY1 and have the first width W1 in the second horizontal direction (Y axis).

The third wiring layer LY3 may include a plurality of wiring patterns. For example, the third wiring layer LY3 may include the plurality of first wiring patterns LY31 and the plurality of second wiring patterns LY32. The plurality of first wiring patterns LY31 and the plurality of second wiring patterns LY32 may be spaced apart in the second horizontal direction (Y axis) to have a second pitch distance PY2, and may have a second width W2 in the second horizontal direction (Y axis). In an embodiment, the second pitch distance PY2 may be greater than the first pitch distance PY1, and the second width W2 may be greater than the first width W1.

The plurality of wiring patterns of the second wiring layer LY2 and the plurality of wiring patterns of the third wiring layer LY3 may be formed to extend in the same horizontal direction. That is, the plurality of wiring patterns of the second wiring layer LY2 and the plurality of wiring patterns of the third wiring layer LY3 may extend in the first horizontal direction (X axis). Accordingly, configurations for connecting the plurality of wiring patterns of the second wiring layer LY2 to the plurality of wiring patterns of the third wiring layer LY3 may be simplified. For example, configurations (e.g., the plurality of first conductive via patterns 121 in FIG. 1) for connecting the plurality of through structures 150 to the second wiring layer LY2 may be simplified, and as a result, an electrical length connecting the plurality of through structures 150 to the second wiring layer LY2 may be shortened, thereby potentially reducing deterioration due to an IR drop and/or EM deterioration, when compared to a related semiconductor device.

Figure 8:
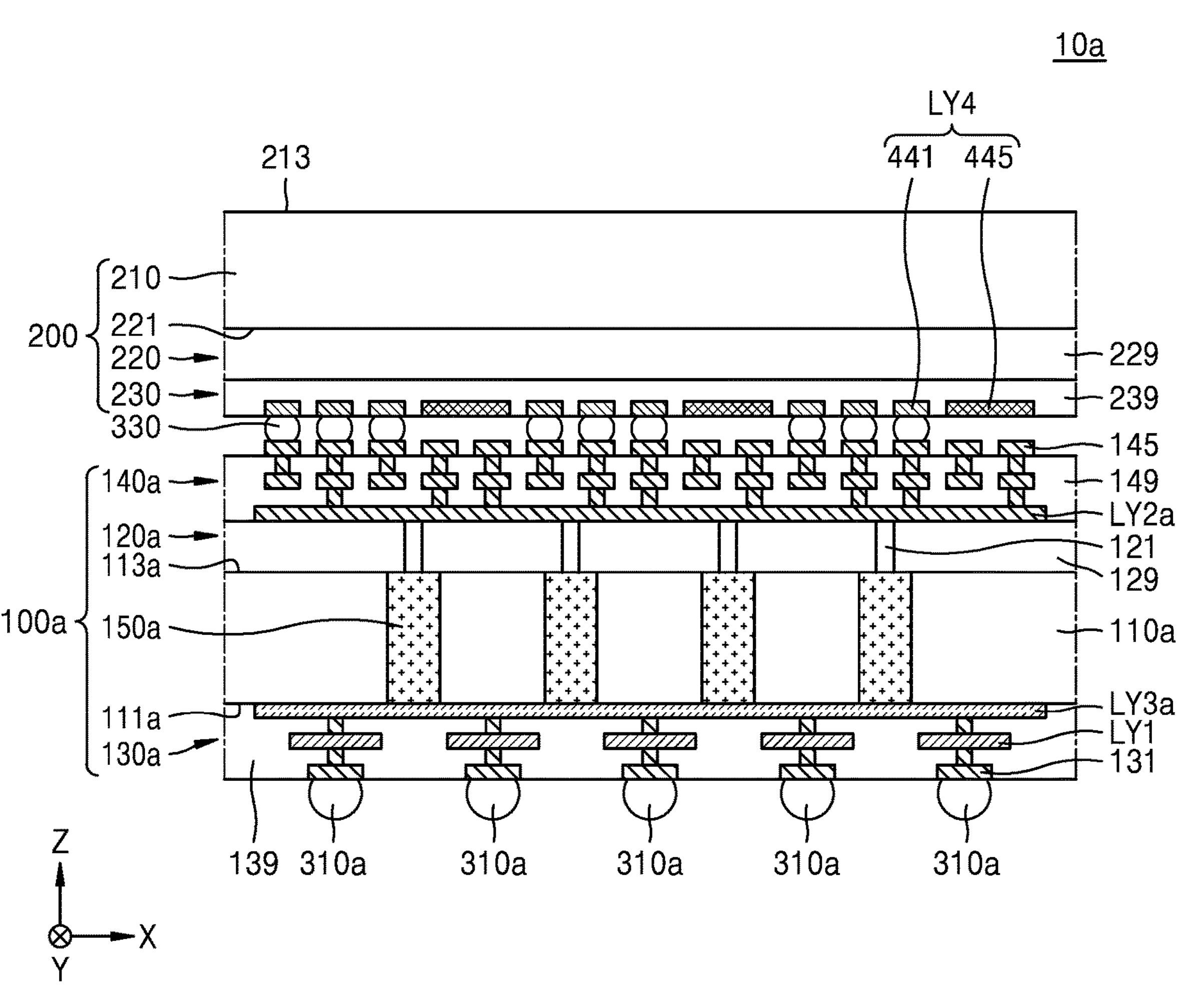
FIG. 8 is a cross-sectional view illustrating a semiconductor package, according to some embodiments.

FIG. 8 is a cross-sectional view illustrating a semiconductor package 10*a* according to some embodiments. The semiconductor package 10*a* of FIG. 8 may include and/or may be similar in many respects to the semiconductor package 10 described above with reference to FIG. 1, and may include additional features not mentioned above. Consequently, repeated descriptions of the semiconductor package 10*a* described above with reference to FIG. 1 may be omitted for the sake of brevity.

Referring to FIG. 8, the semiconductor package 10*a* may include a first semiconductor chip 100*a*, a plurality of external connection terminals 310*a* attached to a lower surface of the first semiconductor chip 100*a*, the second semiconductor chip 200 stacked on the first semiconductor chip 100*a*, and the plurality of connection bumps 330 disposed between the first semiconductor chip 100*a* and the second semiconductor chip 200. In an embodiment, the first semiconductor chip 100*a* may include a macro cell that may include, but not be limited to, a memory chip, such as SRAM, and/or a logic chip in which a logic circuit is implemented.

The first semiconductor chip 100*a* may include a first substrate 110*a*, a plurality of through structures 150*a*, a first device layer 120*a*, a first lower wiring structure 130*a*, and a first upper wiring structure 140*a*. The through structure 150*a* may also be referred to as a through electrode.

The first substrate 110*a* may include a first surface 111*a* and a second surface 113*a* opposite to each other. For example, the first surface 111*a* may be and/or may include an inactive surface of the first substrate 110*a* and the second surface 113*a* may be and/or may include an active surface of the first substrate 110*a*. In an embodiment, the first surface 111*a* may be disposed to face the plurality of external connection terminals 310, and the second surface 113*a* may be disposed to face the second semiconductor chip 200. In an embodiment, the semiconductor package 10*a* may be disposed such that the second surface 113*a*, which may be the active surface of the first semiconductor chip 100*a*, and an active surface of the second semiconductor chip 200 may face each other (face to face). In the semiconductor package 10*a* of FIG. 8, the first surface 111*a* may be referred to as a lower surface of the first substrate 110*a* and the second surface 113*a* may be referred to as an upper surface 113*a* of the first substrate 110*a*.

The first device layer 120*a* may be disposed on the first substrate 110*a*, and the first lower wiring structure 130*a* may be disposed below the first substrate 110*a*. The first lower wiring structure 130*a* may include a redistribution structure formed in a lower portion of the first surface 111*a*, which may be the inactive surface of the first substrate 110*a*. The first lower wiring structure 130*a* may include the pad wiring layer 131, the first wiring layer LY1, and a third wiring layer LY3*a* that may be disposed at different vertical levels. In the first lower wiring structure 130*a*, the pad wiring layer 131 may be a lowermost wiring layer and the third wiring layer LY3*a* may be an uppermost wiring layer.

Figure 9:
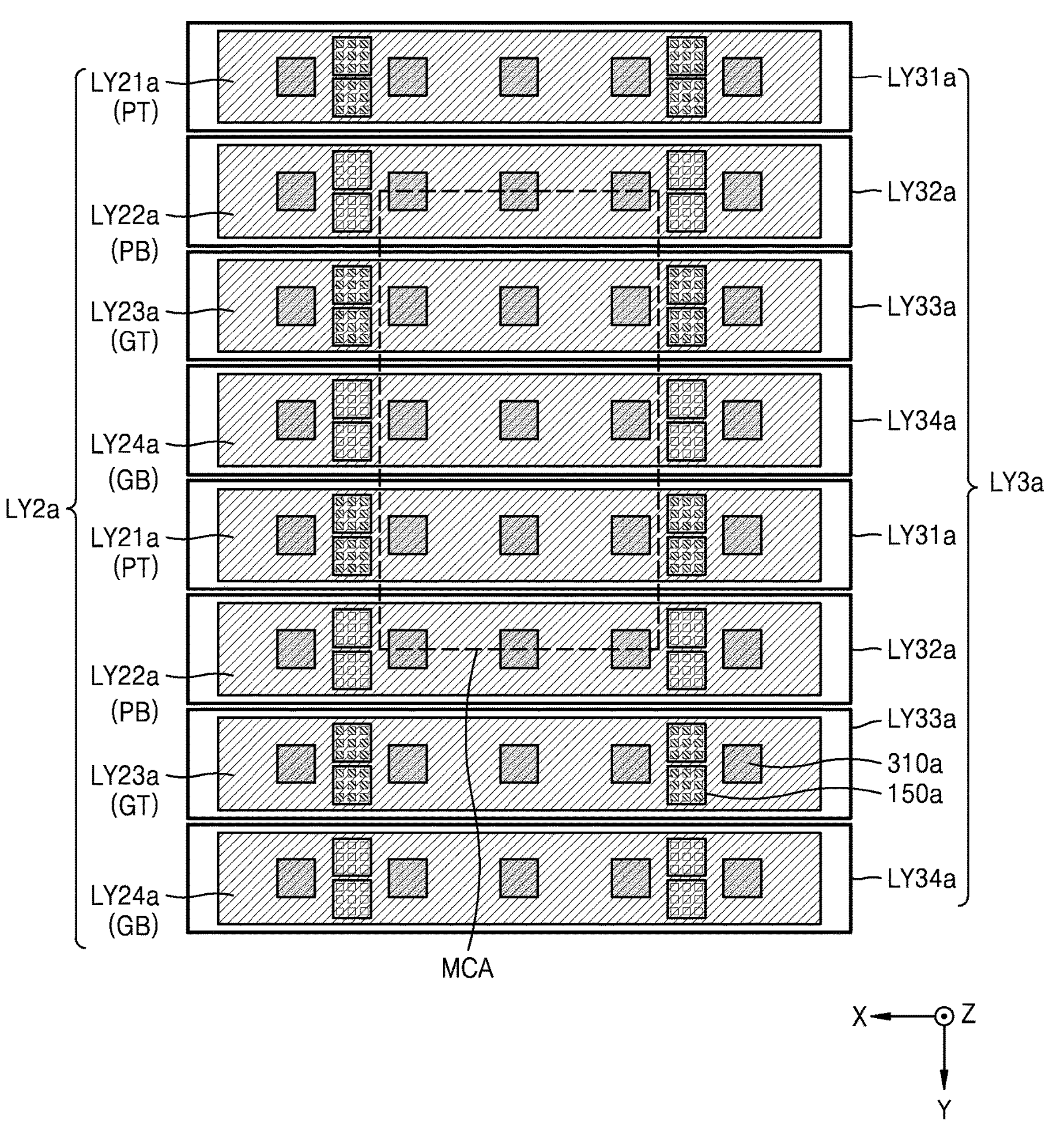
FIG. 9 is a plan view depicting a part of a first semiconductor chip included in a semiconductor package, according to some embodiments.

The third wiring layer LY3*a* may include a plurality of wiring patterns extending in the horizontal direction from the lower portion of the first surface 111*a* of the first substrate 110*a*. For example, as shown in FIG. 9, the third wiring layer LY3*a* may include a plurality of first wiring patterns LY31*a*, a plurality of second wiring patterns LY32*a*, a plurality of third wiring patterns LY33*a*, and a plurality of fourth wiring patterns LY34*a*. The plurality of first wiring patterns LY31*a*, the plurality of second wiring patterns LY32*a*, the plurality of third wiring patterns LY33*a*, and the plurality of fourth wiring patterns LY34*a* may be configured to transmit power signals of a substantially similar and/or the same potential and may be and/or may include line patterns that may be spaced apart from each other in the second horizontal direction (Y direction) and that may extend in the first horizontal direction (X direction). The wiring patterns of the third wiring layer LY3*a* may be configured to receive a first power signal used in the first semiconductor chip 100*a* and a second power signal used in the second semiconductor chip 200.

The first upper wiring structure 140*a* may be disposed on the first substrate 110*a*. The first upper wiring structure 140*a* may include a second wiring layer LY2*a* and the pad wiring layer 145 that may be disposed at different vertical levels. In the first upper wiring structure 140*a*, the second wiring layer LY2*a* may be a lowermost wiring layer and the pad wiring layer 145 may be an uppermost wiring layer. For example, the wiring patterns of the second wiring layer LY2*a* may be and/or may include rails for respectively providing power to the first semiconductor chip 100*a* and the second semiconductor chip 200.

The second wiring layer LY2*a* may include a plurality of wiring patterns extending on the second surface 113*a* of the first substrate 110*a*. For example, the second wiring layer LY2*a* may include a plurality of first wiring patterns (e.g., first wiring patterns LY21*a* in FIG. 9), a plurality of second wiring patterns (e.g., second wiring patterns LY22*a* in FIG. 9), a plurality of third wiring patterns (e.g., third wiring patterns LY23*a* in FIG. 9), and a plurality of fourth wiring patterns (e.g., fourth wiring patterns LY24*a* in FIG. 9). The plurality of first wiring patterns LY21*a*, the plurality of second wiring patterns LY22*a*, the plurality of third wiring patterns LY23*a*, and the plurality of fourth wiring patterns LY24*a* may be configured to transmit power signals of a substantially similar and/or the same potential, and may be and/or may include line patterns that may be spaced apart from each other in the second horizontal direction (Y direction) and that may extend in the first horizontal direction (X direction). The wiring patterns of the second wiring layer LY2*a* may be configured to receive first power signals (e.g., the first supply voltage PB and the second supply voltage GB in FIG. 9) used in the first semiconductor chip 100*a* and second power signals (e.g., the first supply voltage PT and the second supply voltage GT in FIG. 9) used in the semiconductor chip 200.

The plurality of through structures 150*a* may vertically penetrate the first substrate 110*a*, and the wiring patterns of the second wiring layer LY2a may be electrically connected to the wiring patterns of the third wiring layer LY3a corresponding thereto through the plurality of through structures 150a. With respect to the plurality of through structures 150a, the second wiring layer LY2a may be referred to as an upper wiring layer and the third wiring layer LY3a may be referred to as a lower wiring layer. Each of the plurality of through structures 150a may be configured as a bundle of a plurality of sub-through structures.

In the semiconductor package 10a, the first semiconductor chip 100a and the second semiconductor chip 200 may receive power signals through different electrical paths. The first semiconductor chip 100a may be configured to receive first power signals (e.g., a first supply voltage and a second supply voltage) through an electrical path including the plurality of external connection terminals 310a, a plurality of conductive patterns of the first wiring layer LY1, the plurality of wiring patterns of the third wiring layer LY3a, the plurality of through structures 150a, and the plurality of wiring patterns of the second wiring layer LY2a. That is, the plurality of external connection terminals 310a, the plurality of conductive patterns of the first wiring layer LY1, the plurality of wiring patterns of the third wiring layer LY3a, the plurality of through structures 150a, and the plurality of wiring patterns of the second wiring layer LY2a may function and/or perform as a PDN with respect to the first semiconductor chip 100a.

The second semiconductor chip 200 may be configured to receive second power signals (e.g., a first supply voltage and a second supply voltage) through an electrical path including the plurality of external connection terminals 310a, the plurality of wiring patterns of the third wiring layer LY3a, the plurality of conductive patterns of the first wiring layer LY1, the plurality of through structures 150a, the plurality of wiring patterns of the second wiring layer LY2a, the plurality of connection bumps 330, and the plurality of bump pads 441 of the fourth wiring layer LY4. That is, the plurality of external connection terminals 310a, the plurality of conductive patterns of the first wiring layer LY1, the plurality of wiring patterns of the third wiring layer LY3a, the plurality of through structures 150a, the plurality of wiring patterns of the second wiring layer LY2a, the plurality of connection bumps 330, and the plurality of bump pads 441 of the fourth wiring layer LY4 may function and/or perform as a PDN with respect to the second semiconductor chip 200.

Figure 10:
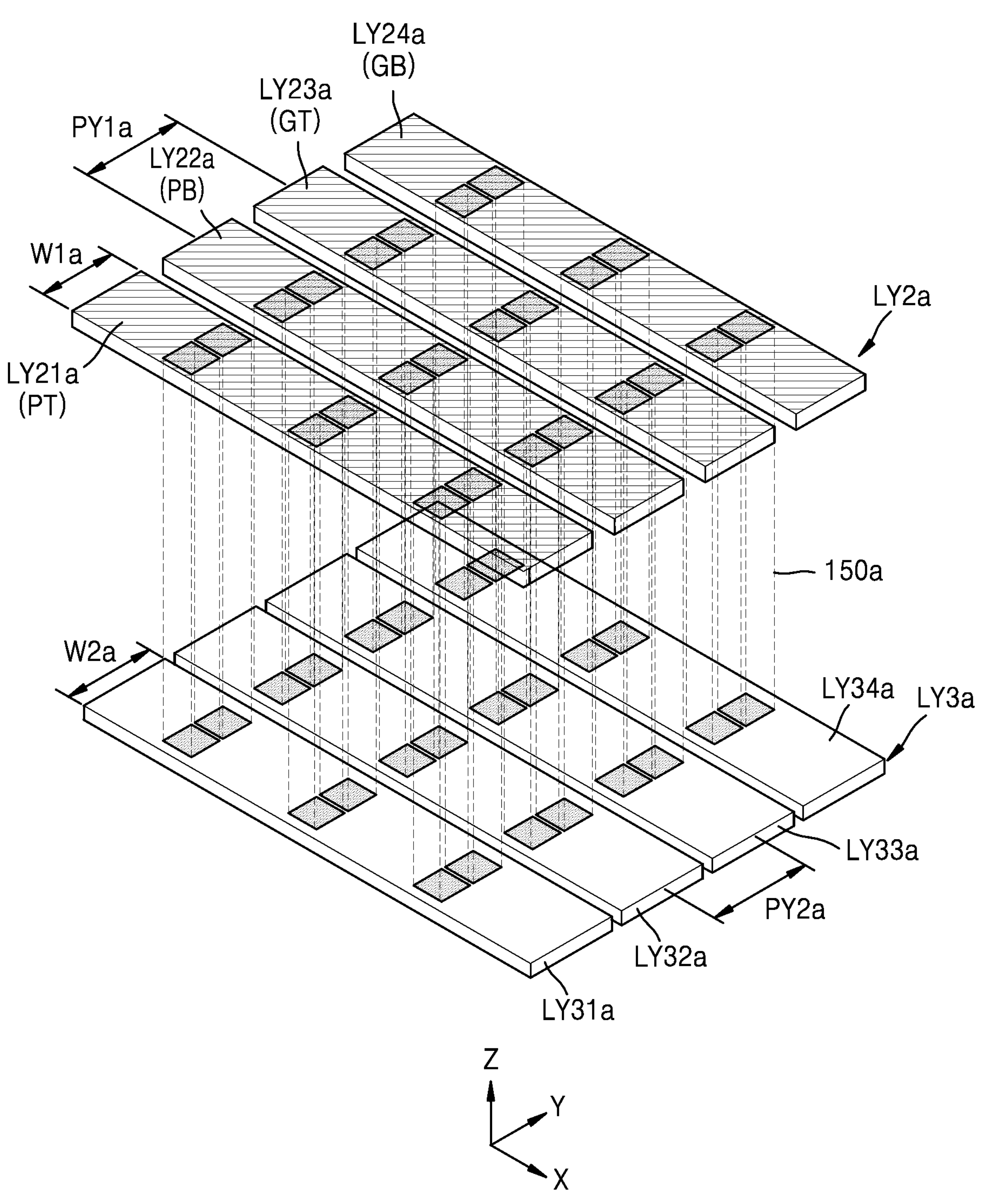
FIG. 10 is a diagram illustrating a second wiring layer, a third wiring layer, and a plurality of through structures included in a semiconductor package, according to some embodiments.

FIG. 9 is a plan view depicting a part of the first semiconductor chip 100a included in the semiconductor package 10a according to some embodiments. FIG. 10 is a diagram illustrating the second wiring layer LY2a, the third wiring layer LY3a, and the plurality of through structures 150a included in the semiconductor package 10a according to some embodiments. In FIGS. 9 and 10, cross-sections of the plurality of external connection terminals 310a and the plurality of through structures 150a are respectively illustrated in a square shape. However, it may be understood that the illustrated shape of these elements is for example only and is not intended to limit the present disclosure. That is, the shape of the cross-section is not limited thereto and may be modified in various ways.

Referring to FIGS. 8 and 9, the second wiring layer LY2a may be disposed on an upper portion of the second surface 113a of the first substrate 110a. The second wiring layer LY2a may include a plurality of wiring patterns. For example, the second wiring layer LY2a may include the plurality of first wiring patterns LY21a, the plurality of second wiring patterns LY22a, the plurality of third wiring patterns LY23a, and the plurality of fourth wiring patterns LY24a The plurality of first to fourth wiring patterns LY21a to LY24a may be and/or may include line patterns that may be spaced apart in the second horizontal direction (Y axis) and that may extend in the first horizontal direction (X axis). In an embodiment, the first wiring pattern LY21a, the second wiring pattern LY22a, the third wiring pattern LY23a, and the fourth wiring pattern LY24a may be sequentially disposed in the second horizontal direction (Y axis). In an optional or additional embodiment, such a disposition of the first to fourth wiring patterns LY21a, LY22a, LY23a, and LY24a may be repeated.

The third wiring layer LY3a may be disposed in a lower portion of the first surface 111a of the first substrate 110a. The third wiring layer LY3a may include a plurality of wiring patterns. For example, the third wiring layer LY3a may include the plurality of first wiring patterns LY31a, the plurality of second wiring patterns LY32a, the plurality of third wiring patterns LY33a, and the plurality of fourth wiring patterns LY34a. The plurality of first wiring patterns LY31a, the plurality of second wiring patterns LY32a, the plurality of third wiring patterns LY33a, and the plurality of fourth wiring patterns LY34a may extend in the first horizontal direction (X axis), and may be spaced apart from each other in the second horizontal direction (Y axis). In an embodiment, the first wiring pattern LY31a, the second wiring pattern LY32a, the third wiring pattern LY33a, and the fourth wiring pattern LY34a may be sequentially disposed in the second horizontal direction (Y axis), and may be repeatedly disposed in the second horizontal direction (Y axis) in the order of the first wiring pattern LY31a, the second wiring pattern LY32a, the third wiring pattern LY33a, and the fourth wiring pattern LY34a.

The plurality of first wiring patterns LY31a of the third wiring layer LY3a may be disposed to overlap the plurality of first wiring patterns LY21a of the second wiring layer LY2a electrically connected to each other in the vertical direction (Z axis). The plurality of first wiring patterns LY21a of the second wiring layer LY2a may be electrically connected to the plurality of first wiring patterns LY31a of the third wiring layer LY3a respectively through the plurality of through structures 150a disposed in lower portions thereof in a direction opposite to the vertical direction (Z axis). Accordingly, the plurality of first wiring patterns LY31a of the third wiring layer LY3a, the plurality of first wiring patterns LY21a of the second wiring layer LY2a, and the plurality of through structures 150a disposed therebetween may function and/or perform as a PDN for providing the first supply voltage PT to the second semiconductor chip 200.

The plurality of second wiring patterns LY32a of the third wiring layer LY3a may be disposed to overlap with the plurality of second wiring patterns LY22a of the second wiring layer LY2a electrically connected thereto in the vertical direction (Z axis). The plurality of second wiring patterns LY22a of the second wiring layer LY2a may be electrically connected to the plurality of second wiring patterns LY32a of the third wiring layer LY3a respectively through the plurality of through structures 150a disposed in lower portions thereof in the direction opposite to the vertical direction (Z axis). Consequently, the plurality of second wiring patterns LY32a of the third wiring layer LY3a, the plurality of second wiring patterns LY22a of the second wiring layer LY2a, and the plurality of through structures 150a disposed therebetween may function and/or perform as a PDN for providing the first supply voltage PB to the first semiconductor chip 100a.

The plurality of third wiring patterns LY33*a* of the third wiring layer LY3*a* may be disposed to overlap with the plurality of third wiring patterns LY23*a* of the second wiring layer LY2*a* electrically connected thereto in the vertical direction (Z axis). The plurality of third wiring patterns LY23*a* of the second wiring layer LY2*a* may be electrically connected to the plurality of third wiring patterns LY33*a* of the third wiring layer LY3*a* respectively through the plurality of through structures 150*a* disposed in lower portions thereof in the direction opposite to the vertical direction (Z axis). Accordingly, the plurality of third wiring patterns LY33*a* of the third wiring layer LY3*a*, the plurality of third wiring patterns LY23*a* of the second wiring layer LY2*a*, and the plurality of through structures 150*a* disposed therebetween may function and/or perform as a PDN for providing the second supply voltage GT to the second semiconductor chip 200.

The plurality of fourth wiring patterns LY34*a* of the third wiring layer LY3*a* may be disposed to overlap with the plurality of fourth wiring patterns LY24*a* of the second wiring layer LY2*a* electrically connected thereto in the vertical direction (Z axis). The plurality of fourth wiring patterns LY24*a* of the second wiring layer LY2*a* may be electrically connected to the plurality of fourth wiring patterns LY34*a* of the third wiring layer LY3*a* respectively through the plurality of through structures 150*a* disposed in lower portions thereof in the direction opposite to the vertical direction (Z axis). Accordingly, the plurality of fourth wiring patterns LY34*a* of the third wiring layer LY3*a*, the plurality of fourth wiring patterns LY24*a* of the second wiring layer LY2*a*, and the plurality of through structures 150*a* disposed therebetween may function and/or perform as a PDN for providing the second supply voltage GB to the first semiconductor chip 100*a*.

The plurality of first wiring patterns LY31*a*, the plurality of second wiring patterns LY32*a*, the plurality of third wiring patterns LY33*a*, and the plurality of fourth wiring patterns LY34*a* of the third wiring layer LY3*a* may be electrically connected to the plurality of external connection terminals 310*a* respectively corresponding thereto. For example, each of the plurality of external connection terminals 310*a* may be electrically connected to wiring patterns of the third wiring layer LY3*a* disposed to overlap with each of the plurality of external connection terminal 310*a* in the vertical direction (Z axis). That is, the plurality of external connection terminals 310*a* electrically connected to the plurality of first wiring patterns LY31*a* may be disposed in lower portions of the plurality of first wiring patterns LY31*a* in the vertical direction (Z axis), and may be disposed to have a constant pitch distance in the first horizontal direction (X axis), which may be a direction in which the plurality of first wiring patterns LY31*a* may extend. Alternatively or additionally, the plurality of external connection terminals 310*a* that may be electrically connected to the plurality of second wiring patterns LY32*a* may be disposed in lower portions of the plurality of second wiring patterns LY32*a* in the vertical direction (Z axis), and may be disposed to have a constant pitch distance in the first horizontal direction (X axis), which may be a direction in which the plurality of second wiring patterns LY32*a* may extend. As another example, the plurality of external connection terminals 310*a* that may be electrically connected to the plurality of third wiring patterns LY33*a* may be disposed in lower portions of the plurality of third wiring patterns LY33*a* in the vertical direction (Z axis), and may be disposed to have a constant pitch distance in the first horizontal direction (X axis), which may be a direction in which the plurality of third wiring patterns LY33*a* may extend. As another example, the plurality of external connection terminals 310*a* that may be electrically connected to the plurality of fourth wiring patterns LY34*a* may be disposed in lower portions of the plurality of fourth wiring patterns LY34*a* in the vertical direction (Z axis), and may be disposed to have a constant pitch distance in the first horizontal direction (X axis), which may be a direction in which the plurality of fourth wiring patterns LY34*a* may extend.

The plurality of through structures 150*a* that may be electrically connected to wiring patterns of the second wiring layer LY2*a* may be disposed to overlap with the wiring patterns in the vertical direction (Z axis). For example, the plurality of through structures 150*a* that may be electrically connected to the plurality of first wiring patterns LY21*a* may be disposed in lower portions of the plurality of first wiring patterns LY21*a* in a direction opposite to the vertical direction (Z axis), and may be disposed to have a constant pitch distance in the first horizontal direction (X axis), which may be the direction in which the plurality of first wiring patterns LY21*a* may extend. Alternatively or additionally, the plurality of through structures 150*a* that may be electrically connected to the plurality of third wiring patterns LY23*a* may be disposed in lower portions of the plurality of third wiring patterns LY23*a* in the direction opposite to the vertical direction (Z axis), and may be disposed to have a constant pitch distance in the first horizontal direction (X axis), which may be the direction in which the plurality of third wiring patterns LY23*a* may extend. As another example, the plurality of through structures 150*a* that may be electrically connected to the plurality of fourth wiring patterns LY24*a* may be disposed in lower portions of the plurality of fourth wiring patterns LY24*a* in the direction opposite to the vertical direction (Z axis), and may be disposed to have a constant pitch distance in the first horizontal direction (X axis), which may be the direction in which the plurality of fourth wiring patterns LY24*a* may extend. As another example, the plurality of through structures 150*a* that may be electrically connected to the plurality of second wiring patterns LY22*a* may be disposed in lower portions of the plurality of second wiring patterns LY22*a* in the direction opposite to the vertical direction (Z axis), and may be disposed to have a constant pitch distance in the first horizontal direction (X axis), which may be the direction in which the plurality of second wiring patterns LY22*a* may extend.

The description of the disposition relationship between the plurality of through structures 150 and the wiring patterns of the second wiring layer LY2 described with reference to FIG. 5 may be equally applied to the description of the disposition relationship between the plurality of through structures 150*a* and the wiring patterns of the second wiring layer LY2*a*. That is, the plurality of through structures 150*a* may be disposed to overlap with the wiring patterns of the second wiring layer LY2*a* in the vertical direction (Z axis) within a disposition available area. In an embodiment, the wiring patterns of the second wiring layer LY2*a* may be spaced apart by a first pitch distance (e.g., first pitch PY1*a* in FIG. 10) in the second horizontal direction (Y axis), and at least one through structure 150*a* may be disposed to overlap with a specific wiring pattern of the second wiring layer LY2*a* in the vertical direction (Z axis) within a distance of half the first pitch distance from the specific wiring pattern.

Alternatively or additionally, the description of the disposition relationship between the plurality of through structures 150 and the plurality of external connection terminals 310 described with reference to FIGS. 6A to 6C may be equally applied to the description of the disposition relationship between the plurality of through structures 150*a* and the plurality of external connection terminals 310*a*. That is, the plurality of through structures 150*a* may be disposed so as not to overlap with the plurality of external connection terminals 310*a* in the vertical direction (Z axis), and the plurality of through structures 150*a* may be disposed between two external connection terminals 310*a* disposed adjacent in the first horizontal direction (X axis) with respect to a plane parallel to the first substrate 110*a*.

The macro cell area MCA, in which a macro cell may be disposed, may be formed in an area where the plurality of through structures 150*a* are not disposed. The size of the macro cell area MCA may vary according to a pitch distance between the plurality of through structures 150*a* in the first horizontal direction (X axis).

Referring to FIGS. 9 and 10, the second wiring layer LY2*a* may include the plurality of first wiring patterns LY21*a*, the plurality of second wiring patterns LY22*a*, the plurality of third wiring patterns LY23*a*, and the plurality of fourth wiring patterns LY24*a*. The plurality of first to fourth wiring patterns LY21*a* to LY24*a* may be spaced apart in the second horizontal direction (Y axis) to have the first pitch distance PY1*a* and have a first width W1*a* in the second horizontal direction (Y axis).

The third wiring layer LY3*a* may include the plurality of first wiring patterns LY31*a*, the plurality of second wiring patterns LY32*a*, the plurality of third wiring patterns LY33*a*, and the plurality of fourth wiring patterns LY34*a*. The plurality of first wiring patterns LY31*a*, the plurality of second wiring patterns LY32*a*, the plurality of third wiring patterns LY33*a*, and the plurality of fourth wiring patterns LY34*a* may be spaced apart in the second horizontal direction (Y axis) to have a second pitch distance PY2*a* and may have a second width W2*a* in the second horizontal direction (Y axis). In an embodiment, the second pitch distance PY2*a* may be the same as the first pitch distance PY1*a*. However, the present disclosure is not limited thereto, and the relationship between the second pitch distance PY2*a* and the first pitch distance PY1*a* may be modified in various ways. In an embodiment, the second width W2*a* may be substantially similar and/or the same as the first width W1*a*. However, the present disclosure is not limited thereto, and the second width W2*a* may be greater than and/or smaller than the first width W1*a*.

The plurality of wiring patterns of the second wiring layer LY2*a* and the plurality of wiring patterns of the third wiring layer LY3*a* may be formed to extend in the same horizontal direction. That is, plurality of wiring patterns of the second wiring layer LY2*a* and the plurality of wiring patterns of the third wiring layer LY3*a* may extend in the first horizontal direction (X axis). Accordingly, configurations (e.g., the plurality of first conductive via patterns 121 of FIG. 8) for connecting the plurality of wiring patterns of the second wiring layer LY2*a* to the plurality of wiring patterns of the third wiring layer LY3*a* may be simplified, and as a result, an electrical length connecting the plurality of through structures 150*a* to the second wiring layer LY2*a* may be shortened, thereby potentially reducing deterioration due to an IR drop and/or EM deterioration, when compared to a related semiconductor device.

While the present disclosure has been particularly shown and described with reference to embodiments thereof, it may be understood that various changes in form and/or details may be made therein without departing from the spirit and scope of the following claims.

What is claimed is:

1. A semiconductor package, comprising:
a first semiconductor chip;
a second semiconductor chip stacked on the first semiconductor chip; and
a plurality of external connection terminals electrically coupled to a lower surface of the first semiconductor chip,
wherein the first semiconductor chip comprises:
a substrate comprising the lower surface and an upper surface opposite to the lower surface;
a lower wiring layer in a lower portion of the lower surface comprising a first plurality of wiring patterns;
an upper wiring layer in an upper portion of the upper surface comprising a second plurality of wiring patterns;
a plurality of through structures electrically coupling the lower wiring layer to the upper wiring layer and penetrating the substrate; and
a macro cell disposed between the plurality of through structures,
wherein the first plurality of wiring patterns extend in a first horizontal direction,
wherein wiring patterns of the first plurality of wiring patterns are spaced apart from each other by a first pitch distance in a second horizontal direction, and
wherein at least one through structure of the plurality of through structures at least partially overlaps a wiring pattern of the lower wiring layer in a vertical direction within an overlapping distance from the wiring pattern of the lower wiring layer, the overlapping distance being half of the first pitch distance.

2. The semiconductor package of claim 1, wherein the plurality of external connection terminals at least partially overlap the first plurality of wiring patterns in the vertical direction, and
wherein the plurality of external connection terminals have a constant pitch distance in the first horizontal direction.

3. The semiconductor package of claim 1, wherein external connection terminals of the plurality of external connection terminals are spaced apart from each other by the first pitch distance in the first horizontal direction,
wherein the plurality of through structures have a second pitch distance in the first horizontal direction, and
wherein the plurality of external connection terminals deviate from the plurality of through structures in the vertical direction.

4. The semiconductor package of claim 1, wherein the plurality of external connection terminals have the first pitch distance in the first horizontal direction,
wherein the plurality of through structures have a second pitch distance in the first horizontal direction, and
wherein the second pitch distance is a multiple value of the first pitch distance.

5. The semiconductor package of claim 1, wherein the first plurality of wiring patterns comprise:
a plurality of first wiring patterns configured to provide a first supply voltage to the first semiconductor chip,
a plurality of second wiring patterns configured to provide the first supply voltage to the second semiconductor chip,
a plurality of third wiring patterns configured to provide a second supply voltage to the first semiconductor chip, and a plurality of fourth wiring patterns configured to provide the second supply voltage to the second semiconductor chip.

6. The semiconductor package of claim 5, wherein the wiring patterns of the first plurality of wiring patterns are repeatedly disposed in the second horizontal direction in an order of a first wiring pattern of the plurality of first wiring patterns, a second wiring pattern of the plurality of second wiring patterns, a third wiring pattern of the plurality of third wiring patterns, and a fourth wiring pattern of the plurality of fourth wiring patterns.

7. The semiconductor package of claim 5, wherein the plurality of through structures at least partially overlap the plurality of first wiring patterns and the plurality of third wiring patterns in the vertical direction, and wherein the plurality of through structures deviate from the plurality of second wiring patterns and the plurality of fourth wiring patterns in the vertical direction.

8. The semiconductor package of claim 1, wherein each through structure of the plurality of through structures comprises a bundle of a plurality of sub-through structures.

9. The semiconductor package of claim 1, wherein the second plurality of wiring patterns extends in the first horizontal direction, wherein the second plurality of wiring patterns have a second pitch distance in the second horizontal direction, and wherein the second plurality of wiring patterns at least partially overlap the first plurality of wiring patterns in the vertical direction.

10. A semiconductor package, comprising:

a first semiconductor chip;

a second semiconductor chip stacked on the first semiconductor chip; and a plurality of external connection terminals electrically coupled to a lower surface of the first semiconductor chip, wherein the first semiconductor chip comprises:

a substrate comprising the lower surface and an upper surface opposite to the lower surface;

a lower wiring layer in a lower portion of the lower surface comprising a first plurality of wiring patterns;

an upper wiring layer in an upper portion of the upper surface and comprising a second plurality of wiring patterns;

a plurality of through structures electrically coupling the lower wiring layer to the upper wiring layer and penetrating the substrate; and a macro cell disposed between the plurality of through structures, wherein the second plurality of wiring patterns extends in a first horizontal direction, wherein wiring patterns of the second plurality of wiring patterns are spaced apart from each other by a first pitch distance in a second horizontal direction, and wherein at least one through structure of the plurality of through structures at least partially overlaps a wiring pattern of the upper wiring layer in a vertical direction within an overlapping distance from the wiring pattern of the upper wiring layer, the overlapping distance being half of the first pitch distance.

11. The semiconductor package of claim 10, wherein the first plurality of wiring patterns extends in the first horizontal direction, wherein wiring patterns of the first plurality of wiring patterns are spaced apart from each other in the second horizontal direction, wherein the plurality of external connection terminals at least partially overlaps the first plurality of wiring patterns in the vertical direction, and wherein the plurality of external connection terminals has a constant pitch distance in the first horizontal direction.

12. The semiconductor package of claim 10, wherein the plurality of external connection terminals has the first pitch distance in the first horizontal direction, wherein the plurality of through structures has a second pitch distance in the first horizontal direction, and wherein the plurality of external connection terminals deviates from the plurality of through structures in the vertical direction.

13. The semiconductor package of claim 10, wherein the plurality of external connection terminals has the first pitch distance in the first horizontal direction, wherein the plurality of through structures has a second pitch distance in the first horizontal direction, and wherein the second pitch distance is a multiple value of the first pitch distance.

14. The semiconductor package of claim 10, wherein the first plurality of wiring patterns comprises:

a plurality of first wiring patterns configured to provide a first supply voltage to the first semiconductor chip, a plurality of second wiring patterns configured to provide the first supply voltage to the second semiconductor chip, a plurality of third wiring patterns configured to provide a second supply voltage to the first semiconductor chip, and a plurality of fourth wiring patterns configured to provide the second supply voltage to the second semiconductor chip.

15. The semiconductor package of claim 10, wherein the second plurality of wiring patterns comprises:

a plurality of first wiring patterns configured to provide a first supply voltage to the first semiconductor chip, a plurality of second wiring patterns configured to provide the first supply voltage to the second semiconductor chip, a plurality of third wiring patterns configured to provide a second supply voltage to the first semiconductor chip, and a plurality of fourth wiring patterns configured to provide the second supply voltage to the second semiconductor chip.

16. The semiconductor package of claim 10, wherein the second plurality of wiring patterns extends in the first horizontal direction, wherein the wiring patterns of the second plurality of wiring patterns are spaced apart from each other by a second pitch distance in the second horizontal direction, and wherein the second plurality of wiring patterns at least partially overlaps the first plurality of wiring patterns in the vertical direction.

17. A semiconductor package, comprising:

a first semiconductor chip;

a second semiconductor chip stacked on the first semiconductor chip; and a plurality of external connection terminals electrically coupled to a lower surface of the first semiconductor chip, wherein the first semiconductor chip comprises a power delivery network (PDN) configured to deliver power signals to the second semiconductor chip via the plurality of external connection terminals, wherein the PDN of the first semiconductor chip comprises:

a first wiring layer comprising a first plurality of wiring patterns;

a second wiring layer comprising a second plurality of wiring patterns and formed at a second level different from a first level of the first wiring layer; and a plurality of through structures electrically coupling the first wiring layer to the second wiring layer, wherein the first plurality of wiring patterns extends in a first horizontal direction, wherein wiring patterns of the first plurality of wiring patterns are spaced apart from each other by a first pitch distance in a second horizontal direction, and wherein at least one through structure at least partially overlaps a wiring pattern of the first wiring layer in a vertical direction within an overlapping distance from the wiring pattern of the first wiring layer, the overlapping distance being half of the first pitch distance.

18. The semiconductor package of claim 17, wherein the plurality of external connection terminals at least partially overlaps the first plurality of wiring patterns in the vertical direction, wherein the plurality of external connection terminals has the first pitch distance in the first horizontal direction, wherein the plurality of through structures has a second pitch distance in the first horizontal direction, and wherein the plurality of external connection terminals deviates from the plurality of through structures in the vertical direction.

19. The semiconductor package of claim 18, wherein the second pitch distance is a multiple value of the first pitch distance.

20. The semiconductor package of claim 17, wherein the second plurality of wiring patterns extends in the first horizontal direction, wherein wiring patterns of the second plurality of wiring patterns are spaced apart from each other by a second pitch distance in the second horizontal direction, and wherein the first plurality of wiring patterns at least partially overlap the second plurality of wiring patterns in the vertical direction.

* * * * *